United States Patent
Zykin et al.

(10) Patent No.: US 11,189,770 B2
(45) Date of Patent: Nov. 30, 2021

(54) LS GRID CORE LED CONNECTOR SYSTEM AND MANUFACTURING METHOD

(71) Applicants: Andrey Zykin, Getzville, NY (US);
Alcinda Miller, Victor, MT (US);
Stephen Miller, Victor, MT (US)

(72) Inventors: Andrey Zykin, Getzville, NY (US);
Alcinda Miller, Victor, MT (US);
Stephen Miller, Victor, MT (US)

(*) Notice: Subject to any disclaimer, the term of this patent is extended or adjusted under 35 U.S.C. 154(b) by 80 days.

(21) Appl. No.: 16/374,372

(22) Filed: Apr. 3, 2019

(65) Prior Publication Data

US 2020/0321500 A1  Oct. 8, 2020

(51) Int. Cl.
| H01L 33/64 | (2010.01) |
| H01L 33/54 | (2010.01) |
| H01L 33/48 | (2010.01) |
| H01L 23/00 | (2006.01) |

(52) U.S. Cl.
CPC ............ *H01L 33/642* (2013.01); *H01L 24/48* (2013.01); *H01L 24/97* (2013.01); *H01L 33/486* (2013.01); *H01L 33/54* (2013.01); *H01L 33/647* (2013.01); *H01L 2224/4805* (2013.01); *H01L 2224/48463* (2013.01)

(58) Field of Classification Search
CPC ................... H01L 24/97; H01L 24/48; H01L 2224/48463
See application file for complete search history.

(56) References Cited

U.S. PATENT DOCUMENTS

| 4,686,496 A * | 8/1987 | Syrett ................... H01P 1/2084 333/202 |
| 5,716,124 A * | 2/1998 | Hsu ........................... F21S 4/10 362/123 |
| 10,128,426 B1 * | 11/2018 | Zykin ..................... F21K 9/232 |
| 2011/0267814 A1 * | 11/2011 | Moon ..................... F21K 9/275 362/235 |
| 2015/0223402 A1 * | 8/2015 | Krijn ................... F21V 23/0442 47/58.1 LS |
| 2016/0221213 A1 * | 8/2016 | Nakamura ............... B27N 3/14 |
| 2017/0227204 A1 * | 8/2017 | May ..................... H05B 47/185 |
| 2020/0025342 A1 * | 1/2020 | Kleijnen ................... F21S 4/22 |

* cited by examiner

*Primary Examiner* — Evan P Dzierzynski
(74) *Attorney, Agent, or Firm* — Luis Figarella

(57) ABSTRACT

A new method, system and apparatus for mounting mechanically, thermally and electrically light emitting diode (LED), crystals, arrays or packages. The above provides an LED assembly having reduced number of components and costs, superior heat dissipation, mechanical properties and a compact structure. The use of a grid or mesh allows for more efficient and inexpensive removal of heat from one or more LEDs within an LED fixture.

8 Claims, 24 Drawing Sheets

LS GRID CORE LED CONNECTOR SYSTEM AND MANUFACTURING METHOD

CROSS-REFERENCE TO RELATED APPLICATIONS

This application is a Divisional of pending U.S. patent application Ser. No. 17/790,094 titled "LS Grid Core LED Connector System and Manufacturing Method", filed on Oct. 23, 2017 the disclosure of which is being incorporated herein by reference in its entirety.

Patents Cited

The following documents and references are incorporated by reference in their entirety; (Ogawa et al (U.S. Pat. No. 7,714,346), Kang et al (U.S. Pat. No. 7,642,563), Mok et al (U.S. Pat. No. 7,262,438), Zykin (U.S. Pat. No. 9,240,538) and Zykin (U.S. patent application Ser. No. 14/076,682, Ser. No. 14/076,711, Ser. No. 14/989,184 and Ser. No. 14/997,606).

FIELD OF THE INVENTION

The present invention relates to Light Emitting Diodes (LEDs) mounting within electrical and mechanical structures, fixtures, troffers, frames and in particular to devices, systems and methods for the efficient and inexpensive removal of heat from the LEDs in LED light fixtures.

DESCRIPTION OF THE RELATED ART

LEDs promise to revolutionize illumination, through their ultra-efficient conversion of energy/electricity into visible light. Within a decade, we have gone from illumination provided by a 60 W incandescent light bulb being replaced by a 13 W Compact Fluorescent Light bulb (CFL) to a 3 W LED light bulb. In effect, reducing by over 90% the consumption required for similar illumination. The above is not only important because it saves energy, but also because now we can illuminate the world without the need to electrify the world.

An LED is an element in which electrons and holes are combined in a semiconductor junction structure by application of current thereby emitting certain types of light. LEDs are typically formed to have a package structure, in which an LED chip is mounted on a mechanical carrier, frequently referred to as an "LED package." Such an LED package is generally mounted on a printed circuit board (PCB) and receives current applied from electrodes formed on the PCB to thereby emit light.

In general illumination applications, engineers have discovered the importance of generating light in a 360 DEGREE (deg.) envelope, not unlike the way in which an incandescent filament illuminates. To accomplish such goals, a new type of package termed an LED sticks or LED straw has been created. In it, individual LEDs are serially placed along a thin sleeve or slice of material, typically made of a sapphire, ceramic and other material with an electrical conductive capability material. The stick is powered from each end, creating a stick of light.

In an LED package, heat generated from the LED chip has a direct influence on the light emitting performance and life span of the LED package. When heat generated from the LED chip is not effectively removed, dislocation and mismatch occur in a crystal structure of the LED chip. In effect, brightness is related to power applied, so a large amount of heat is generated in an LED chip due to the high currents, heat that must be typically transferred to a heat sink, typically, a separate device for effectively dissipating the generated heat is required.

LEDs are typically mounted on printed circuit boards (PCBs), which are used to mechanically support and electrically connect the LEDs to electronic drivers (power supplies, amplifiers, ballast, etc.) using conductive pathways, tracks or signal traces etched from copper/aluminum and/or electrically transmissive sheets laminated onto a non-conductive substrate. This substrate is typically a dielectric or insulator. Some of these dielectrics include Teflon, FR-4, FR-1, CEM-1 or CEM-3.

The above has a significant limitation, the thermal transfer from the LED package to the heat sink, is going through a plastic, not the optimal way in which to efficiently transfer heat. What is needed, is a way in which to mechanically support and electrically connect the LED package to a heat sink with the highest efficiency possible.

SUMMARY OF THE INVENTION

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

In one aspect the invention is about an LED light source comprising an LED chain formed from one or more LED packages, each said LED package having one or more anode leads and one or more cathode leads, so that at least one said anode lead is mechanically and electrically attached to one or more anode wire mesh(es), and at least one said cathode lead is mechanically and electrically attached to one or more cathode wire mesh(es), wherein one or more of said anode wire mesh(es) and one or more of said cathode wire mesh(es) are electrically connectable to the appropriate polarity of a power source. In another aspect, said anode and cathode wire mesh(es) are comprised of one or more of the following mesh types: wire strand, welded wire mesh, woven wire mesh, expanded wire mesh, expanded metal sheets and/or perforated metal sheets. In another aspect, each said anode and each said cathode wire meshes are inserted into a container shaped as a tube. In yet another aspect, each said anode and cathode wire meshes are bent in 3-D space. In another aspect, each said anode and cathode wire mesh(es) are secured within said tube to a slot. In yet another aspect, said ends of said tube are capped by one or more caps, with at least one said cap having a lead to make electrical connection with one or more said anode wire mesh, and a lead to make electrical connection with one or more said cathode wire mesh. In another aspect, said ends of said tube are capped by one or more caps, with at least one said cap having a lead to make electrical connection with one or more said anode wire mesh, and a lead to make electrical connection with one or more said cathode wire mesh.

In one aspect, the invention is about an LED light source manufacturing method comprising mechanically and electrically attaching at least one anode lead of an LED package to an anode wire mesh, mechanically and electrically attaching at least one cathode lead of said LED package to a cathode wire mesh.

In one aspect, the invention is about an LED light source comprising two or more LED chains, each LED chain formed from one or more LED packages, so that at least one said LED package in each said LED chain has one or more anode leads connected to a common anode or cathode wire mesh and one or more corresponding cathode or anode lead connected to a separate wire mesh, wherein one or more of said anode wire mesh(es) and one or more of said cathode wire mesh(es) are electrically connectable to the appropriate polarity of a power source. In another aspect, each said anode and each said cathode wire meshes are inserted into a container shaped as a tube. In yet another aspect, each said anode and cathode wire meshes are bent in 3-D space. In another aspect, each said anode and cathode wire mesh(es) are secured within said tube to a slot. In yet another aspect, said ends of said tube are capped by one or more caps, with at least one said cap having a lead to make electrical connection with one or more said anode wire mesh, and a lead to make electrical connection with one or more said cathode wire mesh. In another aspect, said ends of said tube are capped by one or more caps, with at least one said cap having a lead to make electrical connection with one or more said anode wire mesh, and a lead to make electrical connection with one or more said cathode wire mesh.

Other features and advantages of the present invention will become apparent upon examining the following detailed description of an embodiment thereof, taken in conjunction with the attached drawings.

Figure 1:
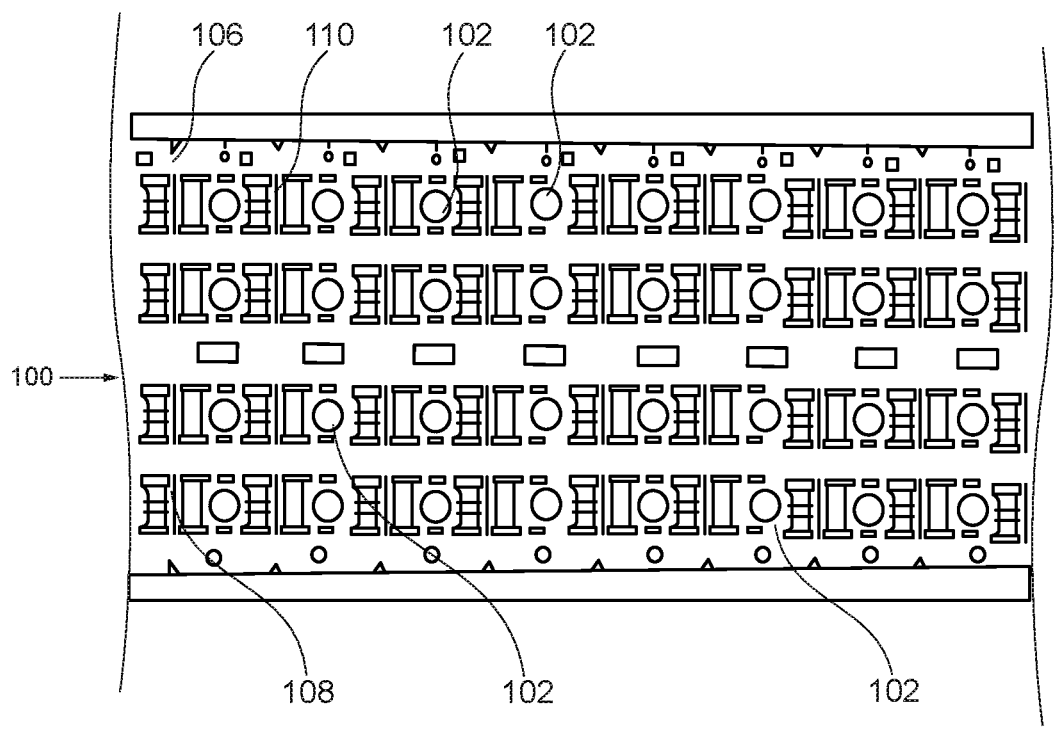
FIGS. 1-5 show some prior art illustrations for LED technology.
Figure 2:
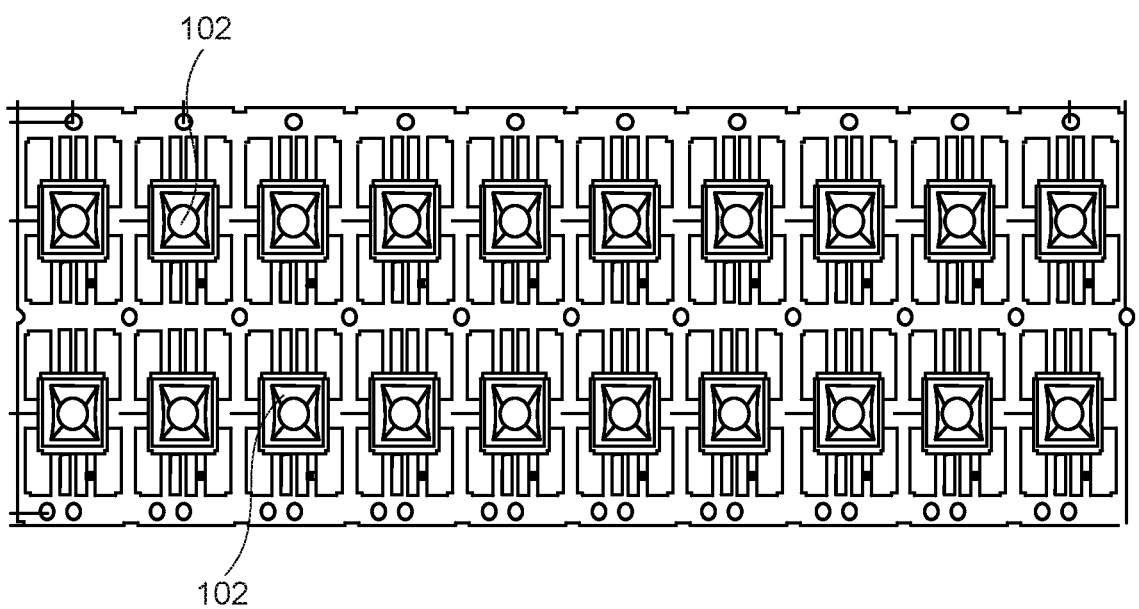
Figure 3:
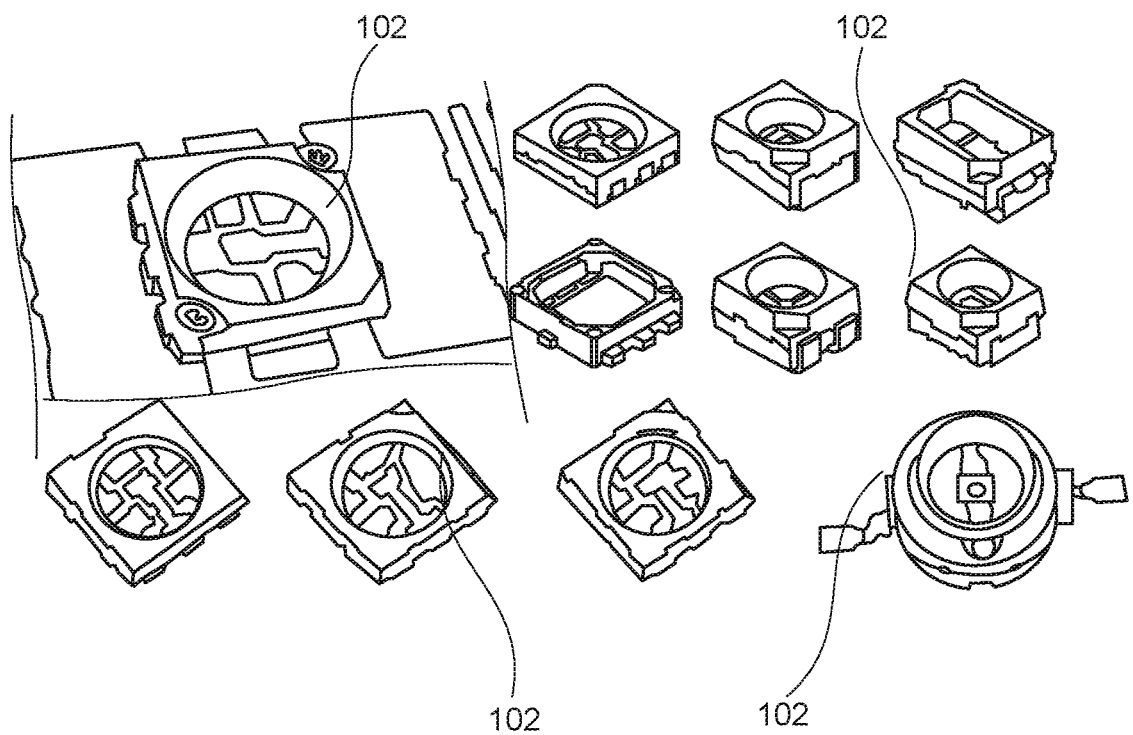
Figure 4:
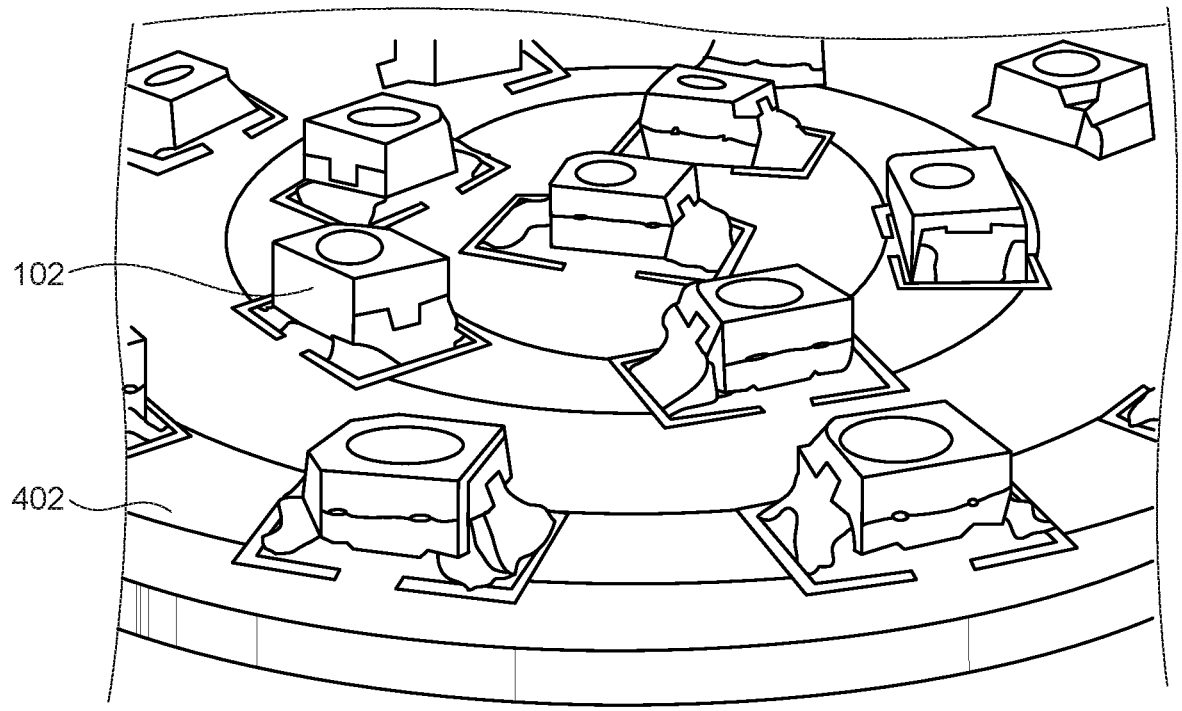

The above-described and other features will be appreciated and understood by those skilled in the art from the following detailed description, drawings, and appended claims.

DETAILED DESCRIPTION OF THE PREFERRED EMBODIMENT

This section is for the purpose of summarizing some aspects of the present invention and to briefly introduce some preferred embodiments. Simplifications or omissions may be made to avoid obscuring the purpose of the section. Such simplifications or omissions are not intended to limit the scope of the present invention.

To provide an overall understanding of the invention, certain illustrative embodiments and examples will now be described. However, it will be understood by one of ordinary skill in the art that the same or equivalent functions and sequences may be accomplished by different embodiments that are also intended to be encompassed within the spirit and scope of the disclosure. The compositions, apparatuses, systems and/or methods described herein may be adapted and modified as is appropriate for the application being addressed and that those described herein may be employed in other suitable applications, and that such other additions and modifications will not depart from the scope hereof.

Simplifications or omissions may be made to avoid obscuring the purpose of the section. Such simplifications or omissions are not intended to limit the scope of the present invention. All references, including any patents or patent applications cited in this specification are hereby incorporated by reference. No admission is made that any reference constitutes prior art. The discussion of the references states what their authors assert, and the applicants reserve the right to challenge the accuracy and pertinence of the cited documents. It will be clearly understood that, although a number of prior art publications are referred to herein, this reference does not constitute an admission that any of these documents form part of the common general knowledge in the art.

As used in the specification and claims, the singular forms "a", "an" and "the" include plural references unless the context clearly dictates otherwise. For example, the term "a transaction" may include a plurality of transaction unless the context clearly dictates otherwise. As used in the specification and claims, singular names or types referenced include variations within the family of said name unless the context clearly dictates otherwise.

Certain terminology is used in the following description for convenience only and is not limiting. The words "lower," "upper," "bottom," "top," "front," "back," "left," "right" and "sides" designate directions in the drawings to which reference is made, but are not limiting with respect to the orientation in which the modules or any assembly of them may be used.

It is acknowledged that the term 'comprise' may, under varying jurisdictions, be attributed with either an exclusive or an inclusive meaning. For the purpose of this specification, and unless otherwise noted, the term 'comprise' shall have an inclusive meaning—i.e. that it will be taken to mean an inclusion of not only the listed components it directly references, but also other non-specified components or elements. This rationale will also be used when the term 'comprised' or 'comprising' is used in relation to one or more steps in a method or process.

Referring to FIGS. 1-5, we see the traditional lead frames or lead LED frames 100, which are used today to distribute and ship LED packages 102 (said packages comprised of both lensed LED packages and non-lensed ones) throughout the industry. These frames consist of a lattice 106 having one or more orthogonal horizontal 108 and vertical 110 members that hold the LEDs in place, and are used for shipping from LED mfr. to the LED light fixture assembly mfr.

At the light fixture manufacturing site, the LEDs 102 are cut off from the frame strips lattice members 108, 110 and become loose, independent, individual light-emitting diodes LEDs 102. During manufacturing, the LEDs 102 are then soldered onto a printed-circuit board (PCB) 402.

Figure 5:
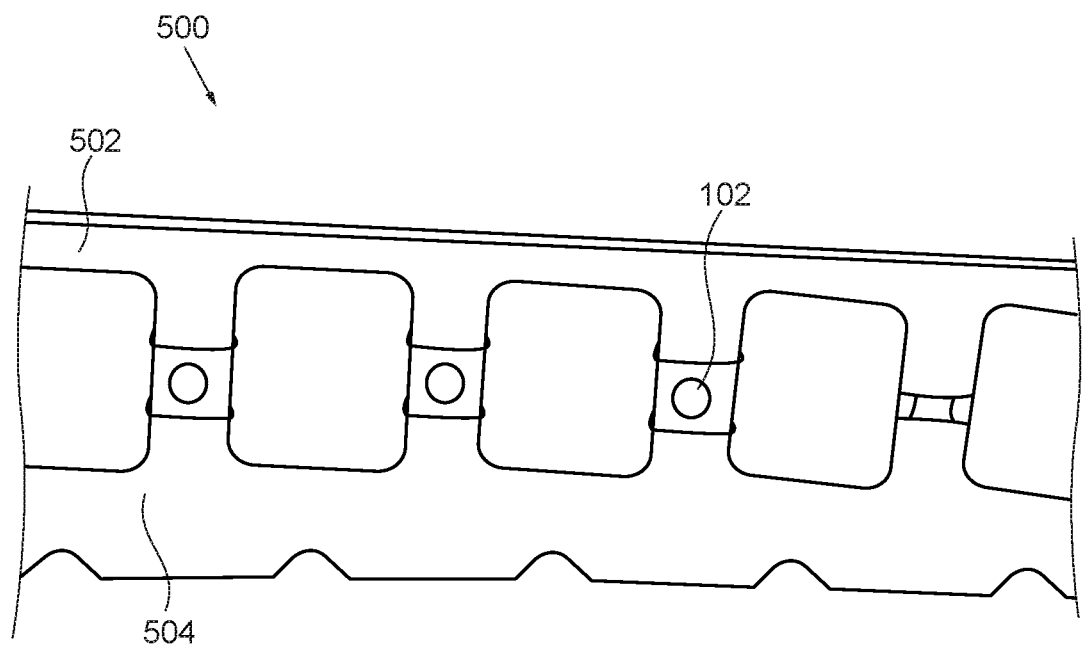
Figure 6:
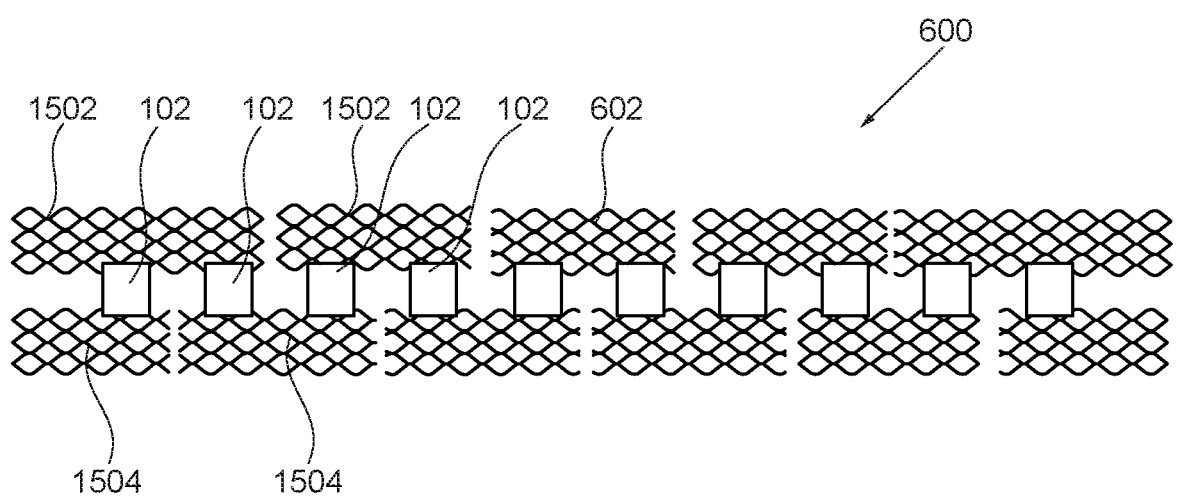
FIG. 6 shows a grid/mesh mounted LED chip assembly, according to an exemplary embodiment of the invention.
Figure 7:
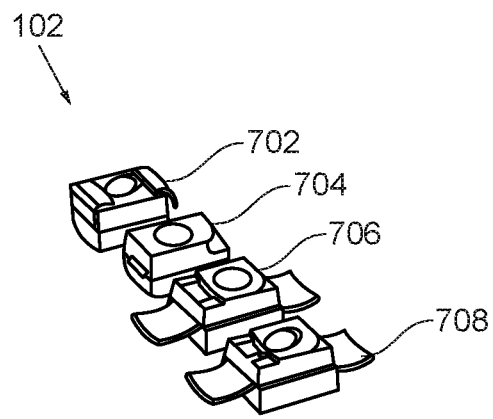
FIGS. 7-8 show various versions of LED chips, according to exemplary embodiments of the invention.
Figure 8:
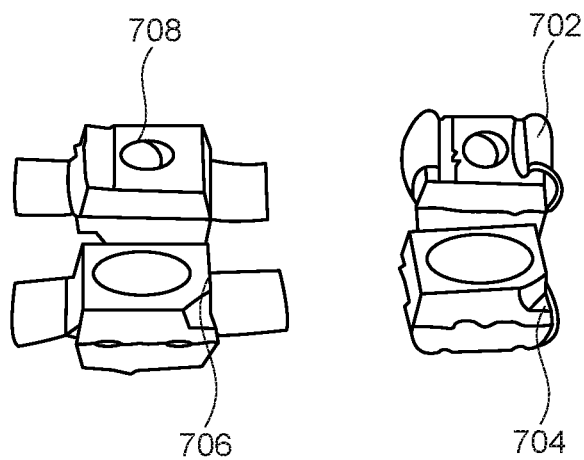
Figure 9:
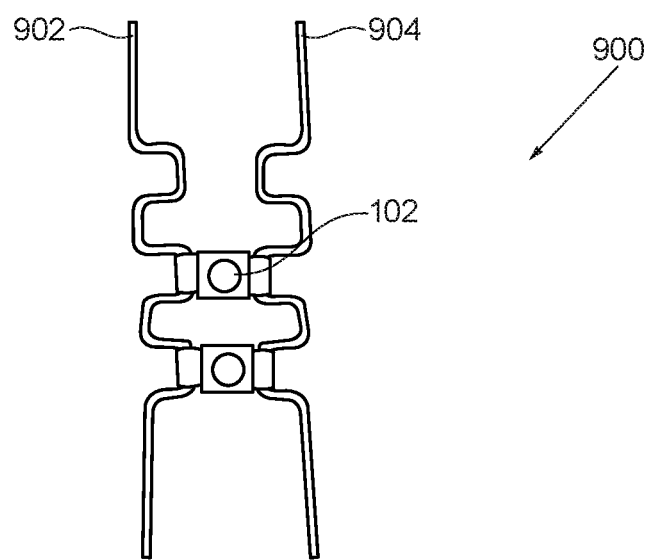
FIGS. 9-10 show various versions of wire mounted LED chips, according to exemplary embodiments of the invention.

The above has a large number of disadvantages, one of the primary ones being the fact that the already aligned and prepositioned LEDs 102 are loosened, before being re-attached to the PCB 402. This step requires machinery to align and position the LEDs 102. Referring to FIG. 5, we see that a quick improvement on the PCB 402 mounting method, would be 500 to mount the LEDs 102 as the link between two frames 502, 504 so that the one or more LED chips 502 are mounted on the frames 502, 504 so that the frame portions 502, 504 act as heat dissipation 'fins' or emitters.

One embodiment of the proposed solution described here improves on the above not only completely eliminating the PCB 402 used to position the LEDs 102, by making the lead frame a grid, mesh or wire frame comprised of one or more wires that connects to the LEDs 102 electrically, mechanically and thermally at one or more points. Note that the grids may be used to attach not only LED 102 components, but also to add the other electronic components necessary to operate the electronics, including resistors, capacitors, drivers, etc., all of them mounted across the voltage difference and/or separately as required.

We disclose here a number of embodiments based on mounting 600 the LEDs 102 on two or more metal frames 602 comprised of one or more wires so as to form a grid or mesh of wires, as opposed to the traditional metal frame 100 and or the frames 500.

When we describe a wire mesh or wire grid, we refer to a number of possible embodiments. including two or more wires, welded wire mesh, woven wire mesh, expanded wire mesh, expanded metal sheets, and perforated metal sheets. Welded wire mesh is a metal wire screen that is made from various alloys including steel, stainless steel, brass and copper. It is available in various sizes and shapes. Grids of parallel longitudinal wires are welded to cross wires at the required spacing, using electric fusion. The machines that are used to produce the mesh have precise dimensional control. In addition, it includes interlocking wire, knit, snare, braid weave, lattice, filigree, penwork, structure tracery Matrix, and waffle assemblies Woven wire mesh is typically also available in steel, stainless steel, brass and copper, woven wire mesh is made as a cloth with wire threads woven at angles. Wires which run lengthwise are known as warp wires, whilst those running perpendicular are weft wires. There are two common styles of weave: plain weave and twill weave. It can be made from various electrically conducive alloys including stainless steel, brass, aluminum, tungsten titanium and copper. Wire cloth can be woven to create a variety of opening sizes and wire diameters. The woven wire mesh may also be stretched to become expanded wire mesh.

Expanded sheet metal is made by first creating multiple slits in the sheet, and then stretching the sheet. The stretching creates a unique diamond pattern opening with one of the strands protruding at a slight angle. These raised strands can be flattened later in the process if desired. This process creates no waste (thus keeping down production costs) and it can add structural strength and thermal transfer efficiency to the product.

Perforated metal sheet is a product that is made from sheet steel that has been fed through a machine that punches out round holes (or other designs). These holes can be straight rows or staggered to increase the amount of the openings. Typically the perimeter of the sheet has a boundary where holes are not punched; this adds stability to the sheet.

The LED chip packages 102 may be comprised of a number of packages based on the configuration of the LED holder leads as extended in various forms 702, 704, 706 and 708. In effect, instead the flat surface 502, 504 is dissipating heat in primarily an up/down direction (that is, along the fascia of the maximum metal surface), with a minimal amount of heat emitted along its edges. In contrast, one proposed embodiment 900 utilizes two primary wire, side bars or guides 902, 904 which mechanically support the one or more LED chips 102. In effect, the side bars provide power to the LED chips via the voltage differential between the anode (902) and the cathode (904) sides of the LED 102 each one, as well as provide cooling of the heat generated within the LED chip.

In another embodiment 1600, the LED chips 102 are powered by a voltage laid across the continuous mesh grids 1502/1504. In an alternate embodiment 600, sequences of two or more LEDs 102 are connected to a voltage source, and the meshes of similar voltages 1502 are powered by parallel connections, so that the LEDs 102 receive the correct voltages.

Figure 20:
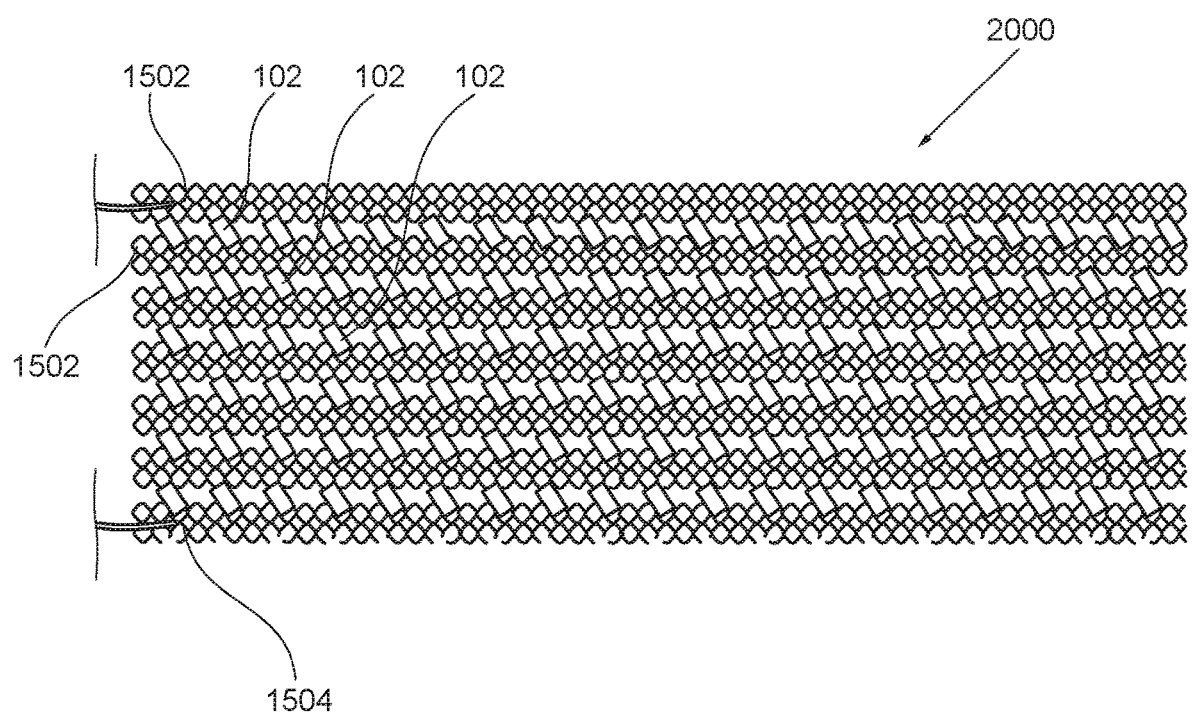
Figure 21:
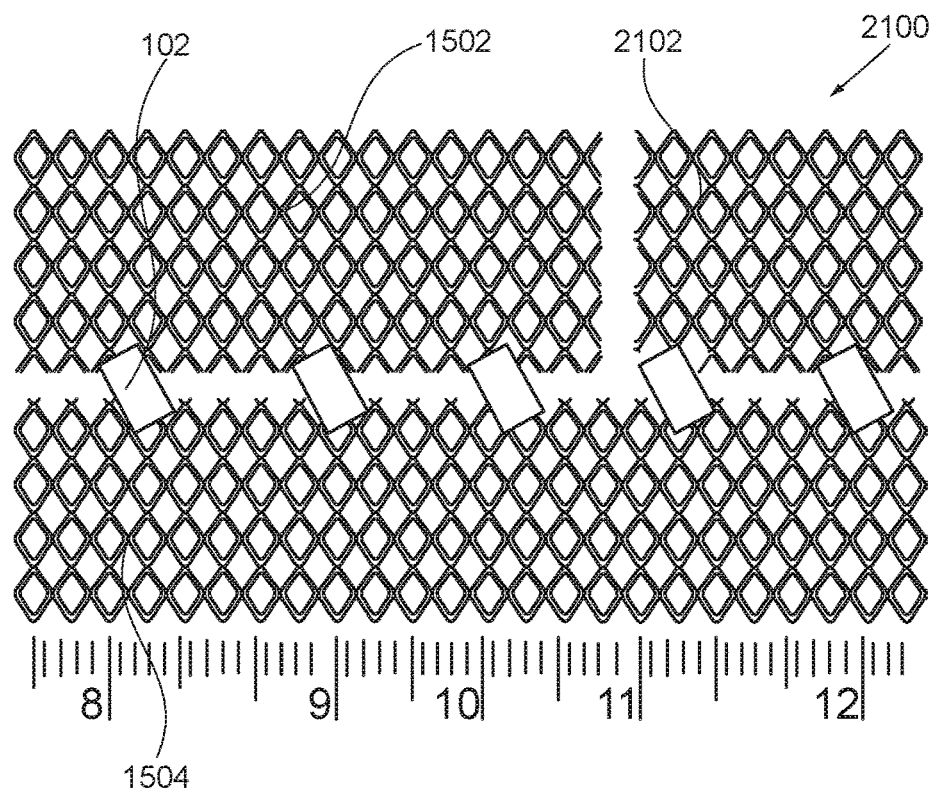

Looking at FIG. 20, we see that in one embodiment a chain of two or more cascading LEDs 102, powered by an initial mesh 1502, and the drop from the first LED row 102, generates a voltage 1502' which powers an LED chip row 102', powering a follow on mesh 1502" of LEDs 102", and successively, until the final mesh 1504 is found. By powering 1502 and 1504, you have an electric circuit that will survive the failure of one particular LED. In an alternate embodiment, the anode 1502 and cathode 1504 could be alternated, so that the odd/even rows of LEDs 102 would be completely powered. In FIG. 21, the meshes 1502 and 2102 have identical voltages.

The heat is transferred to the side bar, which being primarily tube shaped, proceeds to emit the heat energy Omni directionally along the length of the side bar. In addition to the heat dissipation, notice the curvature along the length of the side bar. This provides for significant stress relief along the length of the sidebars as they heat and cool during the power cycle of the LED chips.

Figure 10:
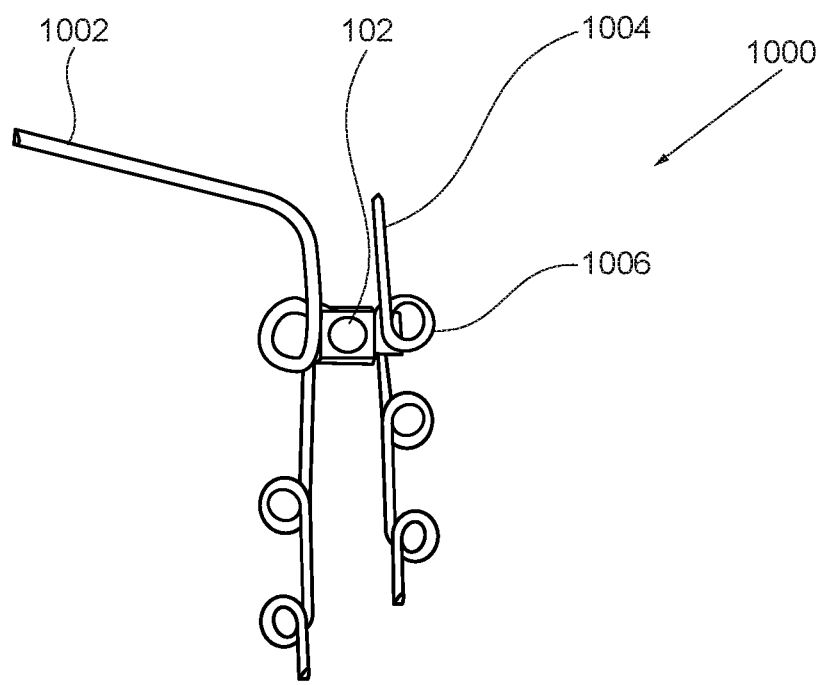
Figure 11:
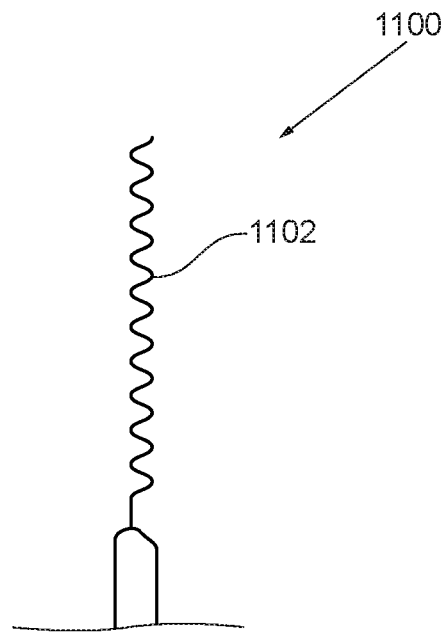
FIGS. 11-13 show various versions of LED chips mounted on wire and wire meshes, according to exemplary embodiments of the invention.
Figure 12:
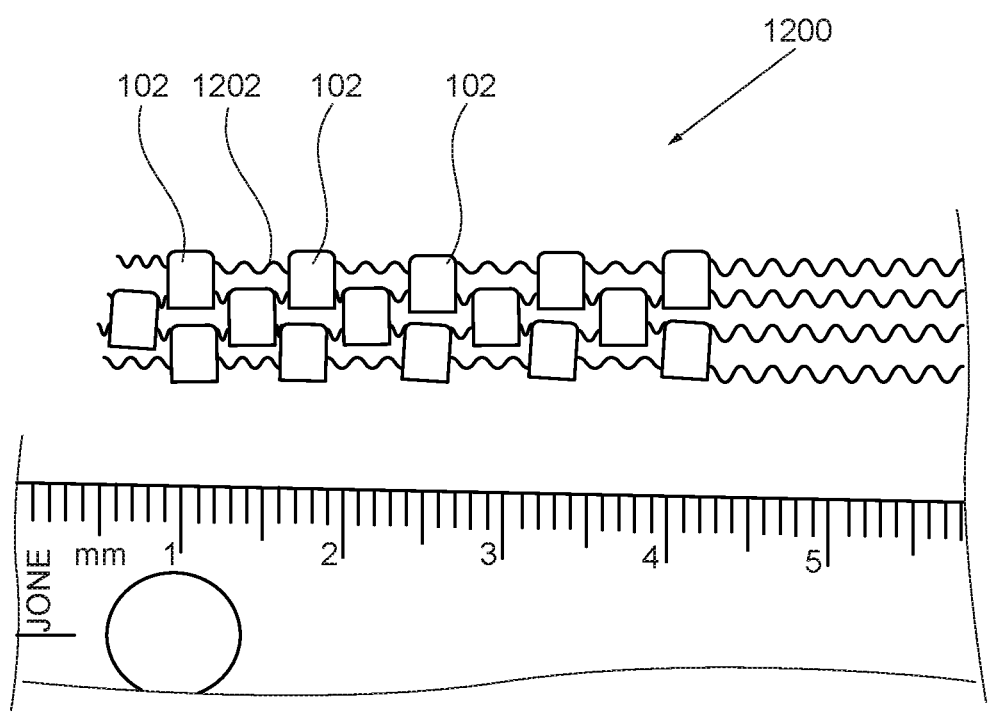
Figure 13:
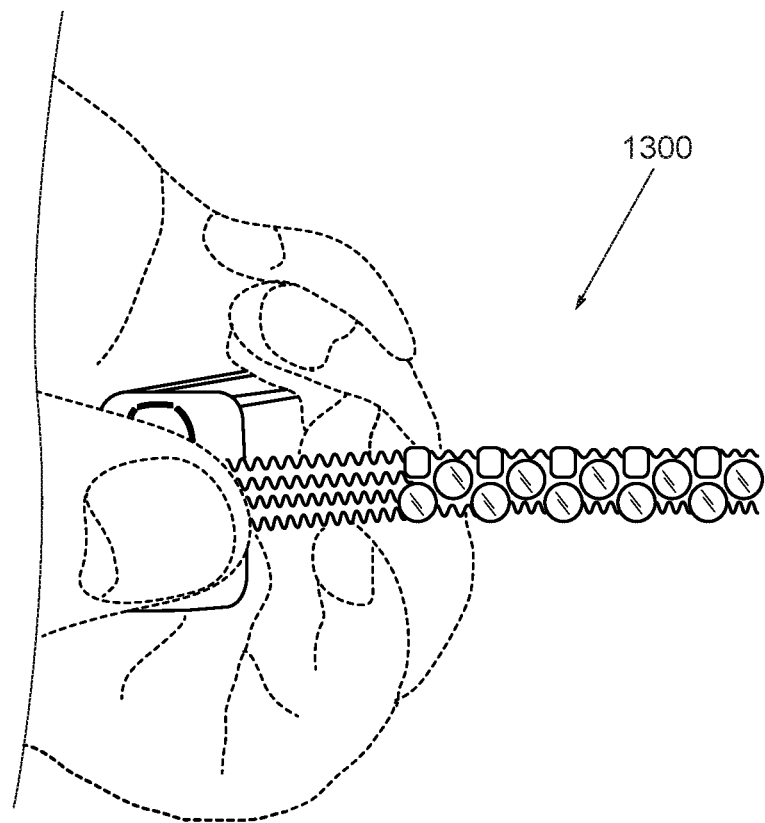
Figure 14:
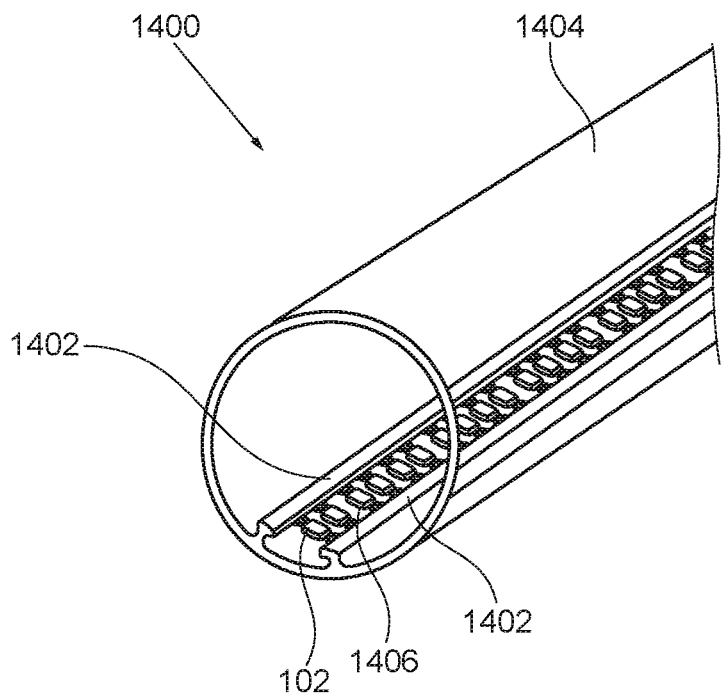
FIGS. 14-15 and 45-47 show tube mounted, mesh versions of LED chip assembly, according to exemplary embodiments of the invention.
Figure 15:
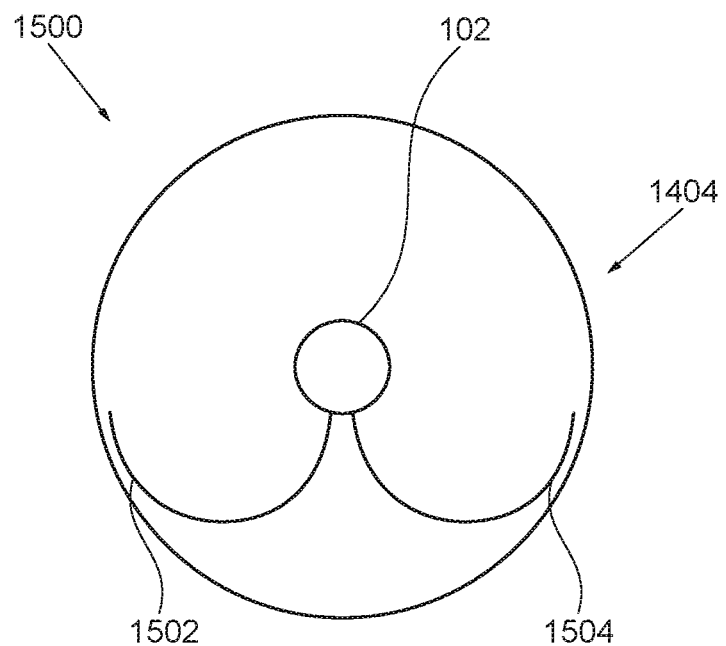
Figure 16:
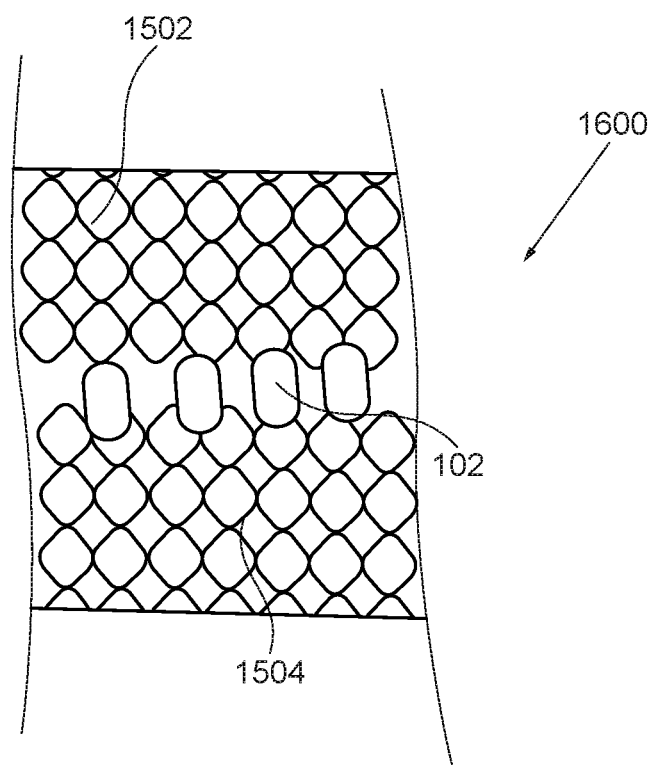
FIGS. 16, 20-21, 23 and 26-37 show grid/mesh mounted LED chip assemblies, according to exemplary embodiments of the invention.
Figure 17:
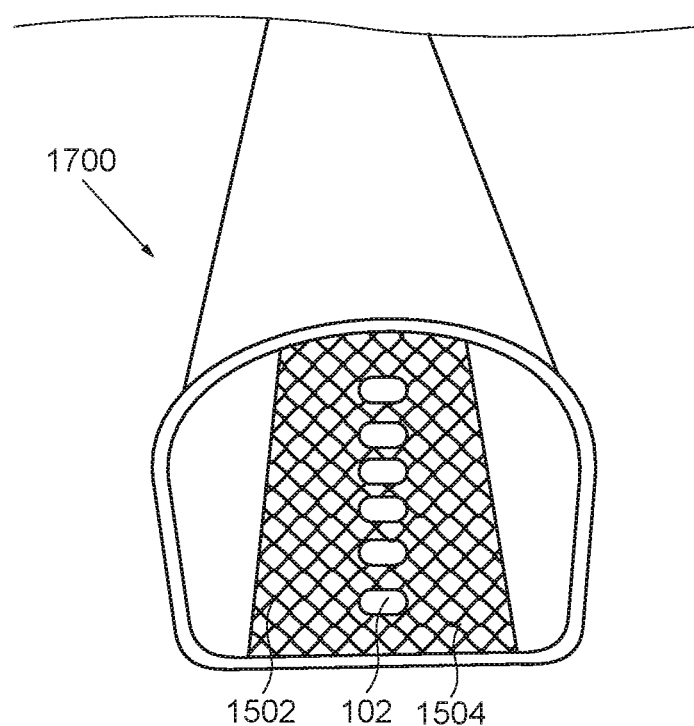
FIGS. 17-19 show tube mounted, mesh versions of LED chip assembly, according to exemplary embodiments of the invention.
Figure 18:
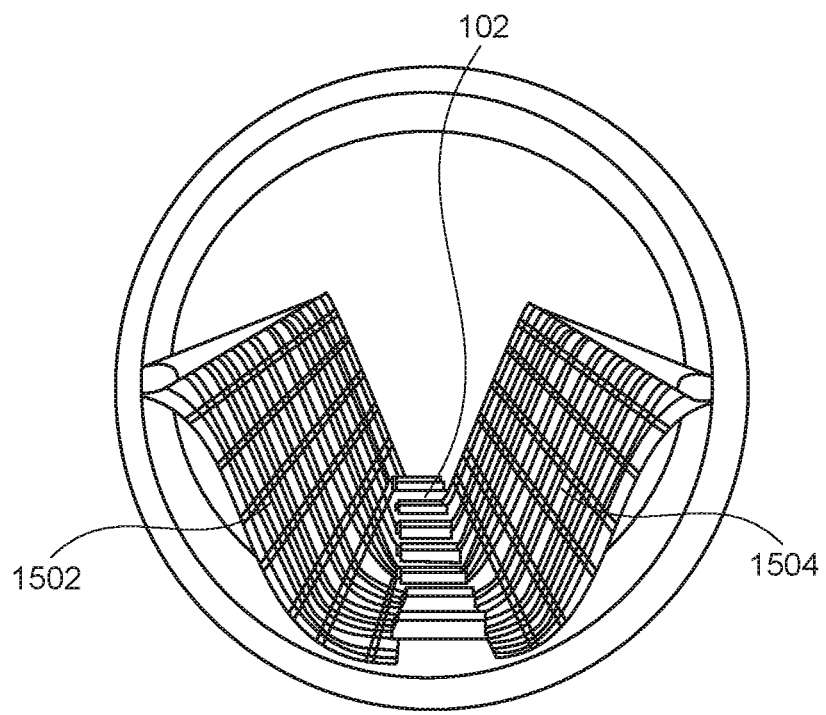
Figure 19:
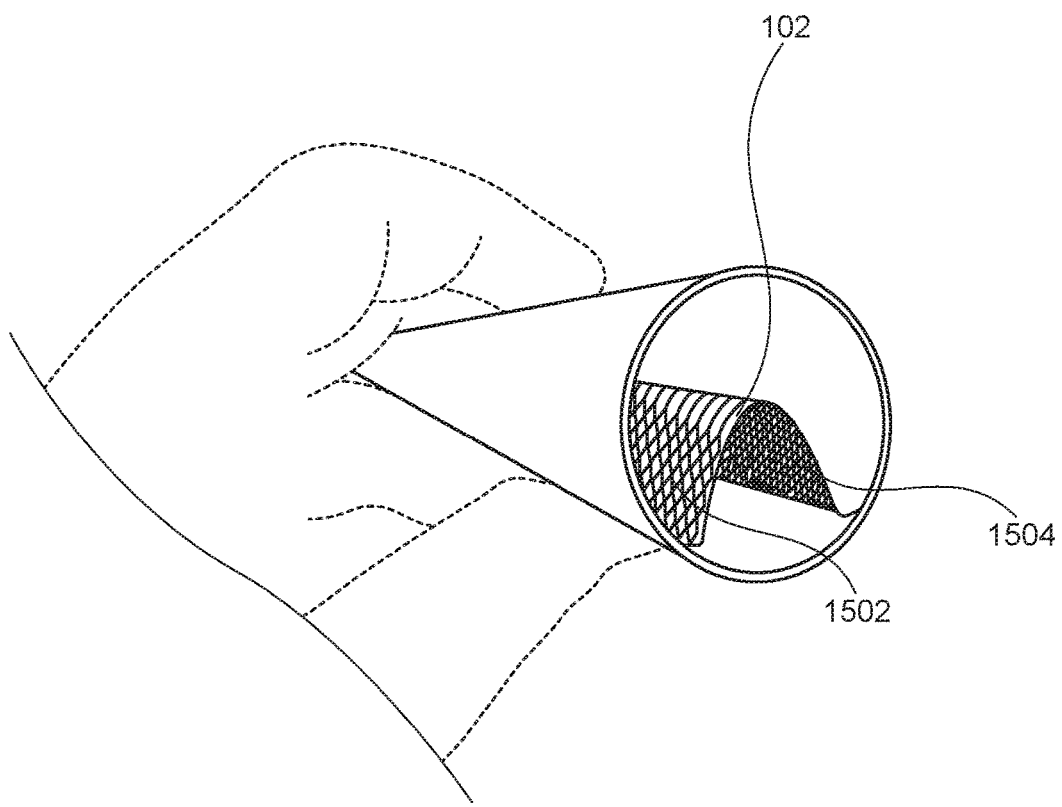

As seen in FIG. 10, the connection 1000 to the LED chip may be accomplished via a loop 1006, which then also contributes to the expansion of the mechanical structure of the side bars 1002/1004 in connection to the LED chips. The loops 1006 may additionally be used to mount the light string 1000. Note the side bars may also be 1100 wavy bar arrangements 1202 onto which the LEDs chips 102 are mounted, in this case using two or more wavy bars 1202 which house LEDs 102 each straddling a bar 1200, so that a sequence of LEDs 102 form the light source stream 1200.

One or more of these LED 102 chains 1406 may be formed by connecting the LEDs 102 to a mesh on each side of the LEDs 102 (side leads 1502 and 1504 each with a separate voltage), so that when inserted 1400 within a tube 1404 along two or more parallel slots 1402 within suitably modified tubes, including but not limited to the more common T-5, T-8 or other suitable enclosure tube 1404 (as well as lamps, bulbs, and other enclosures) the LEDs 102 are suspended in space while the voltage may be provided separately.

Said enclosure tube may have the aforementioned slots 1402 or be smooth 1500 and have the leads 1502 and 1504 from the LED strips 102 bent so they extend outside of the strips without significantly occluding the light emitted from the LEDs. Thus in addition to serving as a thermal radiator, they mechanically support the LED strips 102 within the enclosure tube 1404. The above may include flat bottom formed tubes 1700, as well as triangular shaped (3 sided), with the edges where the triangle sides meet being sharp or rounded (to avoid optical effects).

Said enclosure tube(s) may have the aforementioned slots 1402. Note that in all enclosure cases, i.e. bulbs, lamps or the T-5/T-8 tubes 1404, there could be introduced into the enclosure space a gas mix. Besides a gas mix, the complete lighting package may be immersed in a temperature reducing or cooling fluid, which may be a dielectric to preserve electrical integrity while providing cooling. Such fluids may include inert gases.

The mounting/connecting of the LEDs 102 to the wire's anode/cathodes need not be limited to a single side bar 1002, 1004 or wavy bars 1102, 1202, but in fact may be accomplished by a grid or web of wires 1600, separated into an electrical channel one 1502 and another 1504 (itself formed from wires and/or stamped, laser cut from a sheet), as long as the above described principle of Omni directionally transmitted heat dissipation is obeyed. In effect, we see 1600/2300 an embodiment where a web is split between two zones 1502, 1504 (as above, so that a voltage differential across LEDs can be established between web/wire grid 1502 and 1504), which allows the LED chips 102 straddling the center to be lit when a voltage is applied across the two meshes 1502/1504. As before the ends of the grid 1502/1504 may then be used to fit and hold the LED string within a channel 1402 in a tube 1404, allowing the illumination.

Figure 22:
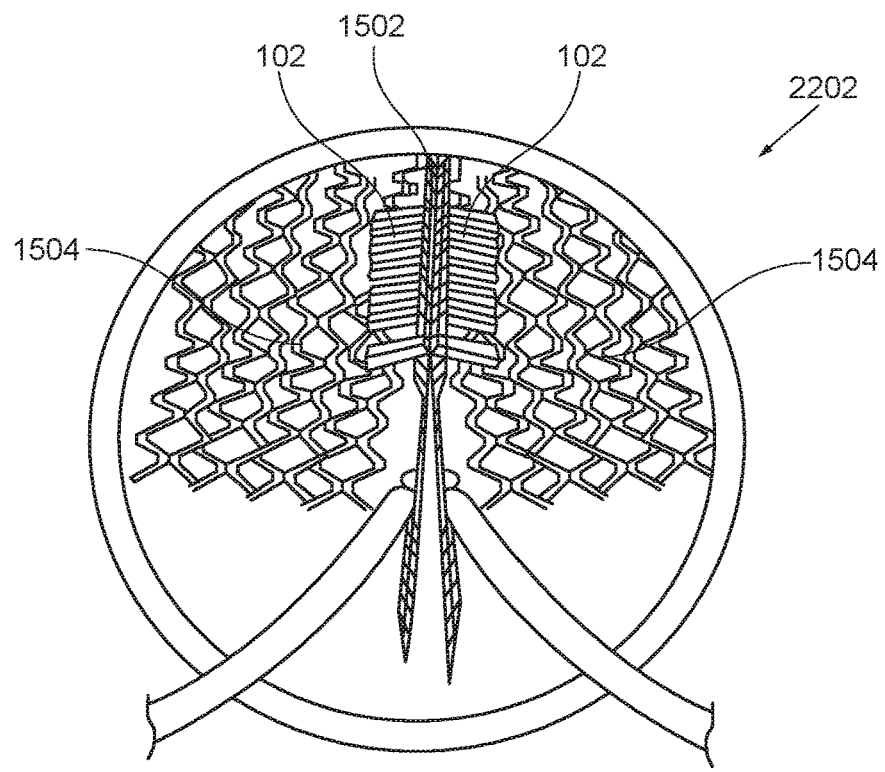
FIGS. 22, 24 and 25 show an X-shaped, tube mounted, mesh versions of LED chip assembly, according to exemplary embodiments of the invention.
Figure 23:
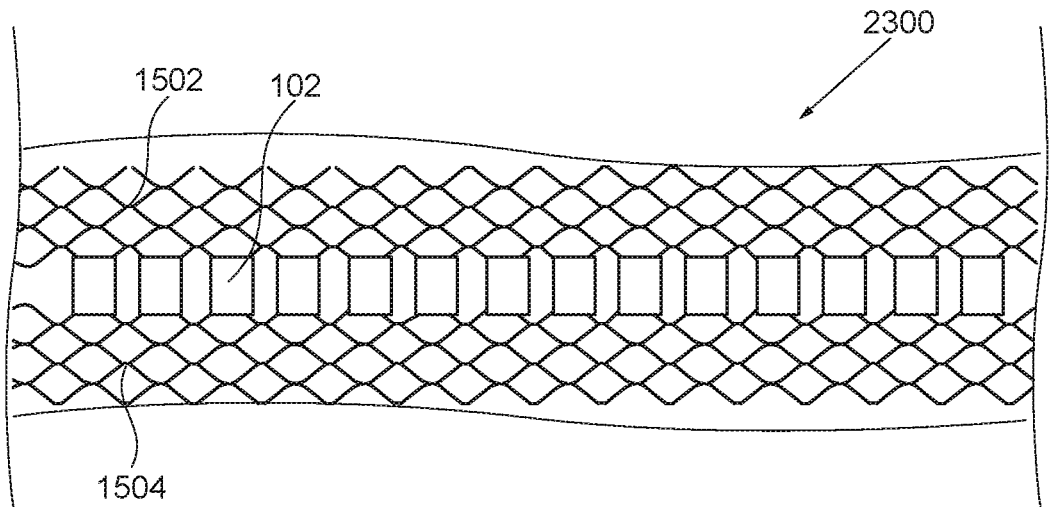
Figure 24:
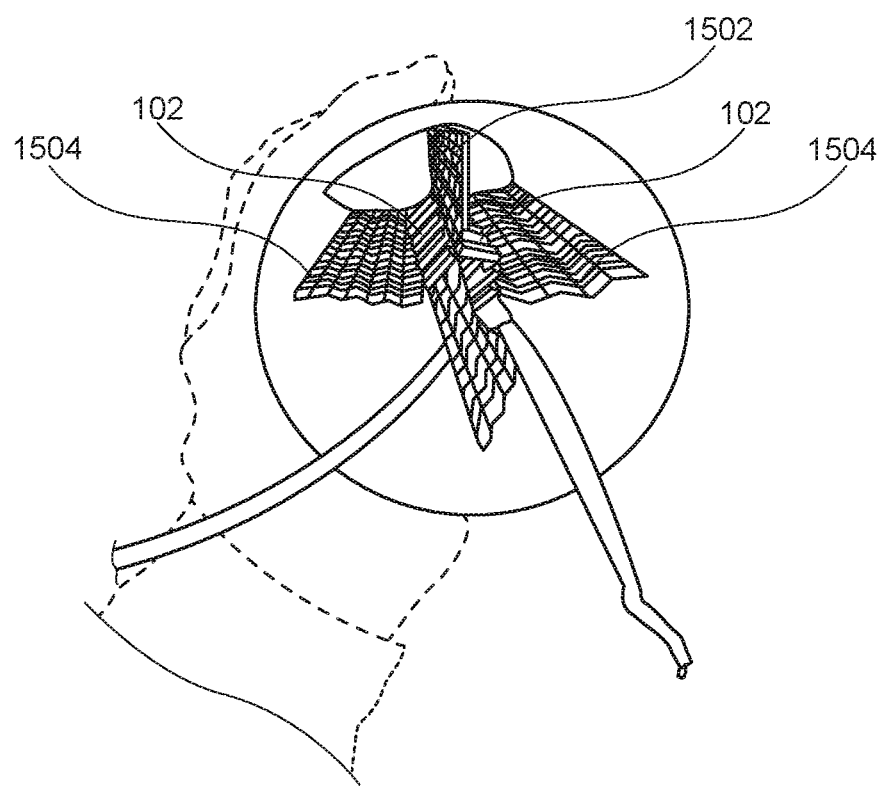
Figure 25:
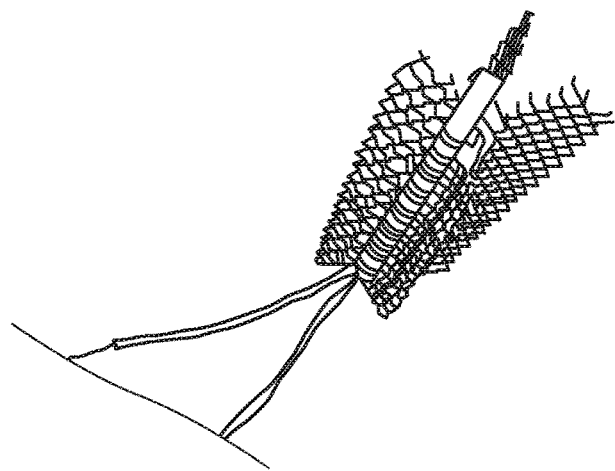

It is notable that the openings in the mesh/grids 1502/1504 not only allow for more efficient cooling (via the Omni-directional heat dissipation aforementioned), but also allow for light to go through (FIGS. 17, 18, 19, 22) improving the Omni-directional lighting of the source. As shown in FIGS. 22, 24-25, the LEDs 102 may jump across X-shaped meshes 1502/1504 so that many more LEDs are packed within a volume.

Looking in detail at FIGS. 22, 24, 25 we see a more dense (volumetrically speaking) collection of LEDs 102 along the center of the assembly 2202 formed by creating an X-shaped, T-shaped or cross of three or more meshes 1502, 1504 with the LEDs 102 at its center. Two central LED chains are formed by connecting the anodes of each LED forming each chain to a single anode mesh, and the cathodes of each LED chain is connected a separate cathode wire mesh (the above may be reversed by connecting the cathodes to a single mesh, then the anodes to two separate meshes. In this form, double the density of LEDs (whose light comes out through the openings in the meshes) is accomplished.

In all cases, the voltage drop between the anode and the cathode sides of the LEDs 102 provide the necessary voltage to control dc LEDs, with the additional advantage of the 'double' row of LEDs within the center. Such an arrangement within a tube may then be simply supported by their placement within the tube, or within slots in the tube. Finally, as with all the other implementations, the cooling effect may be augmented by the addition of a gas or fluid contained within said tube.

Note the LEDs chips 102 may be soldered, chemically attached using conductive glues and/or epoxies, mechanically clamped, interwoven, spot welded, reflowed or otherwise suitably attached to the side bars, wavy bar or grid 1600, as long as the connection is both electrical and thermal (3200, 3500, 3600).

Figure 26:
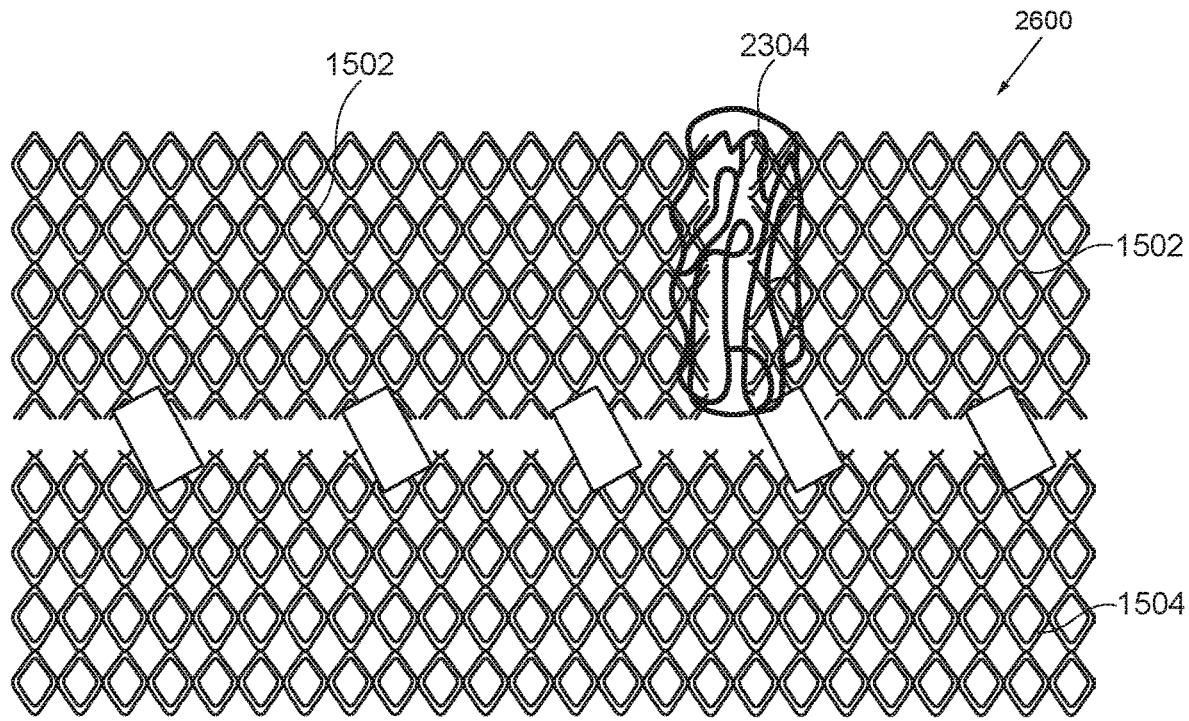
Figures 27, 28:
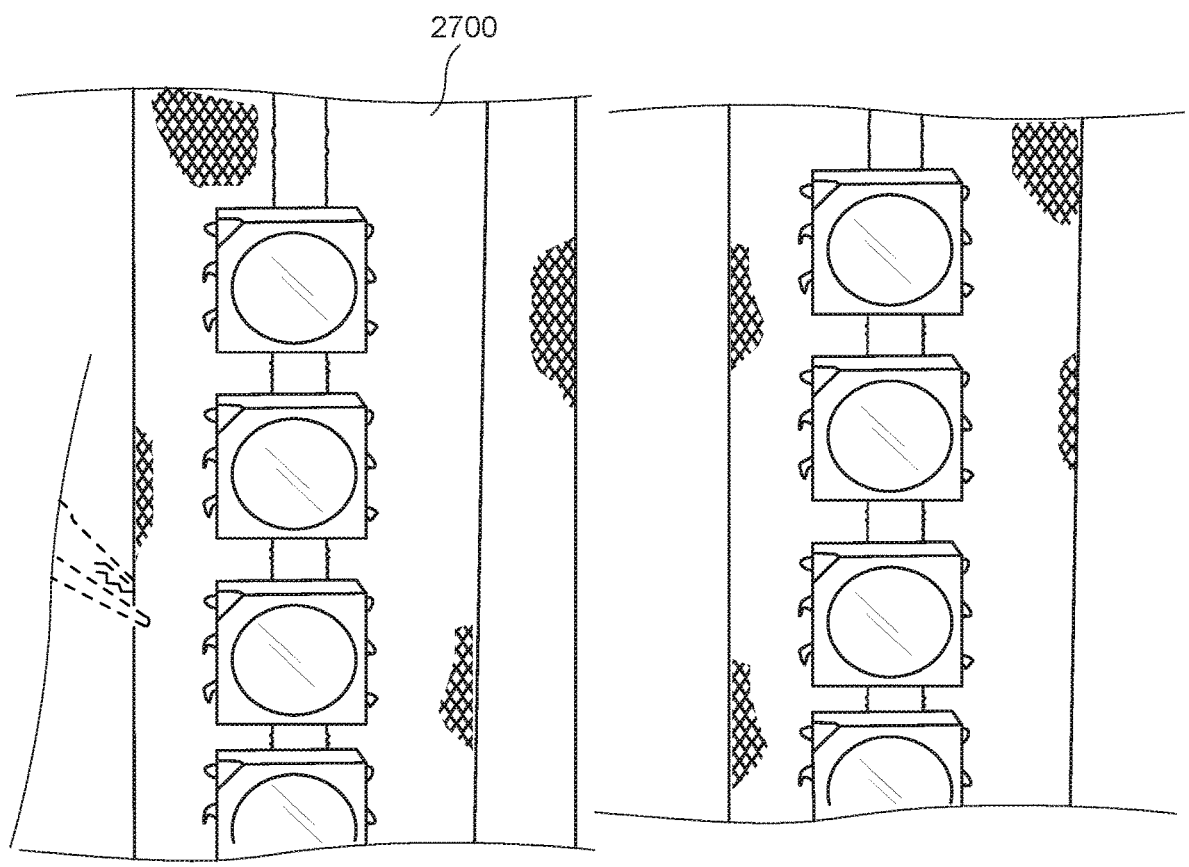
Figure 29:
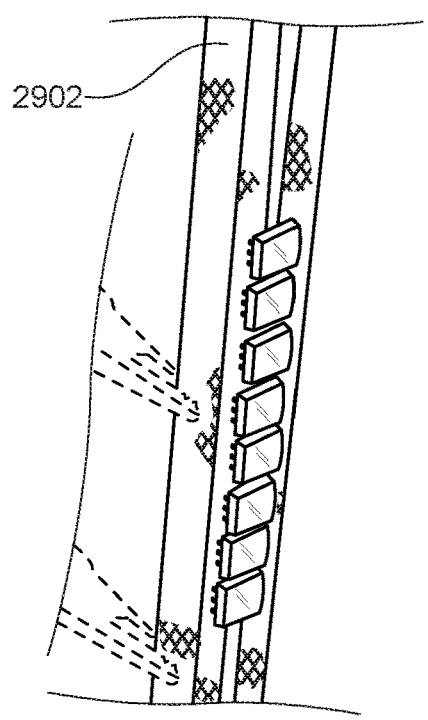
Figure 30:
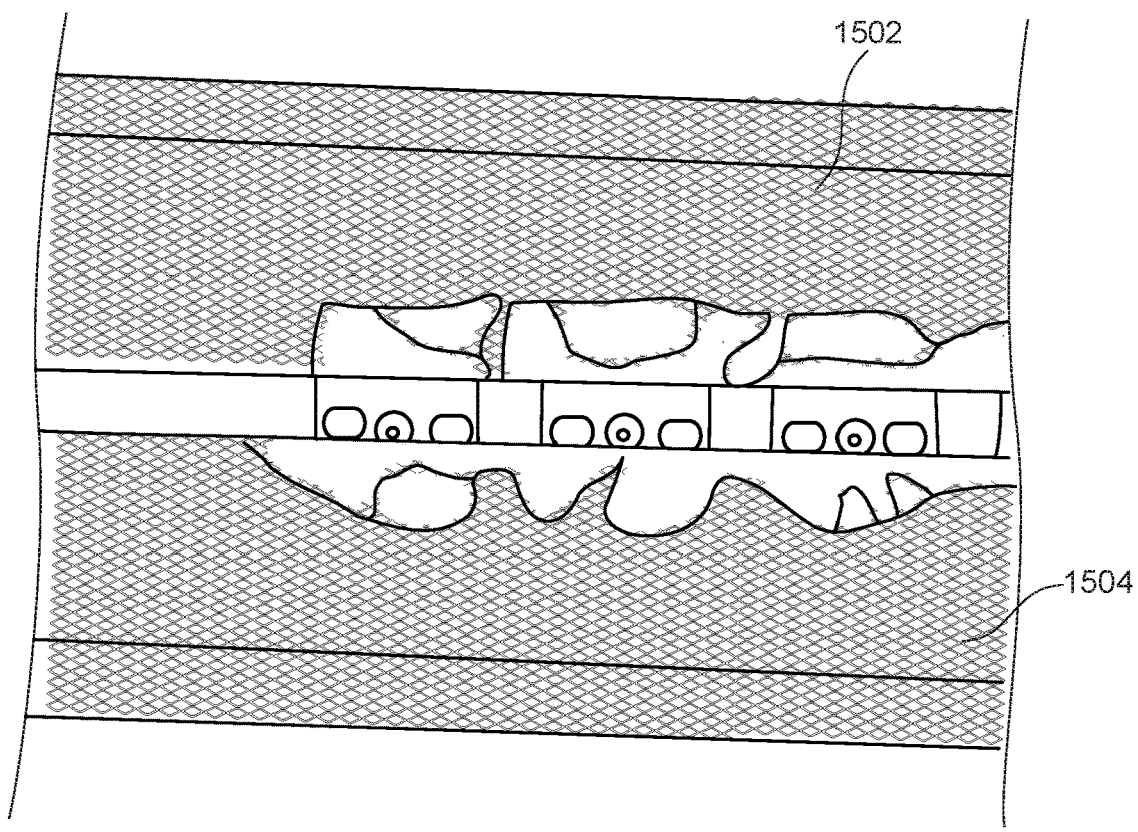
Figure 31:
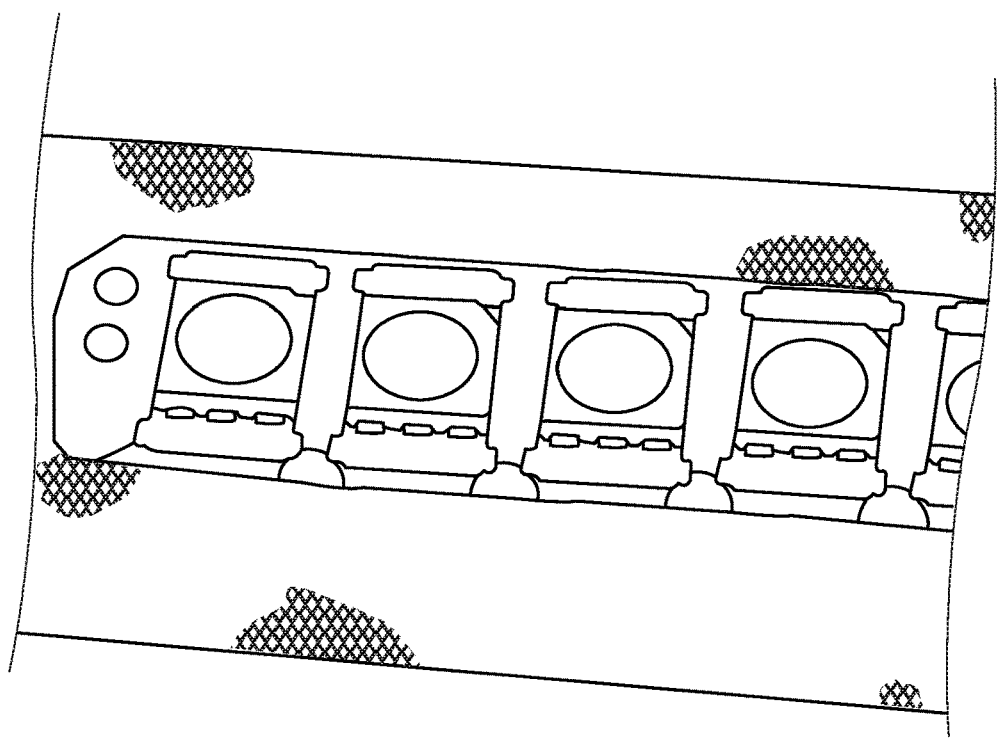
Figure 32:
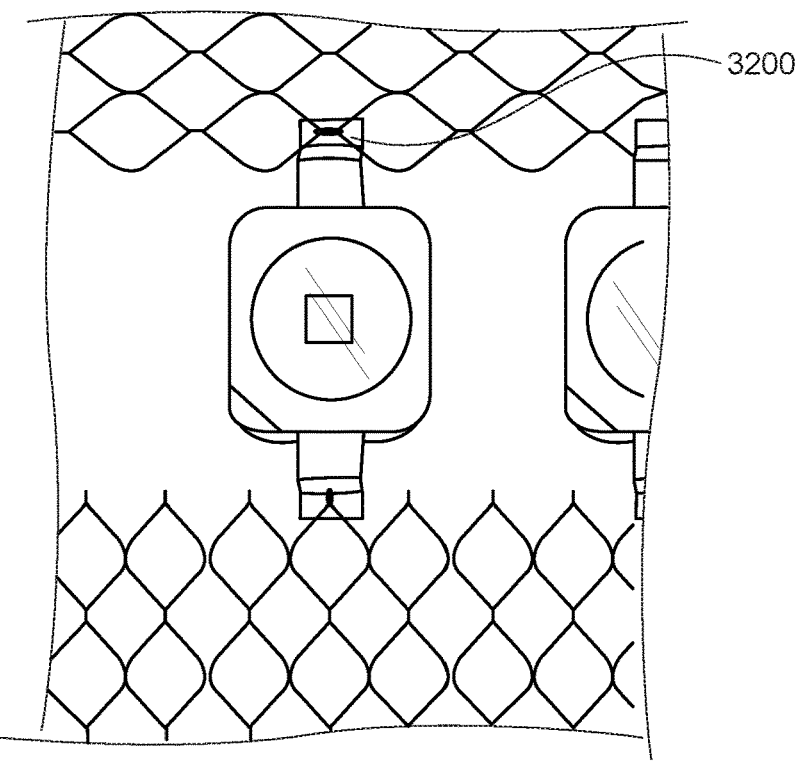
Figure 33:
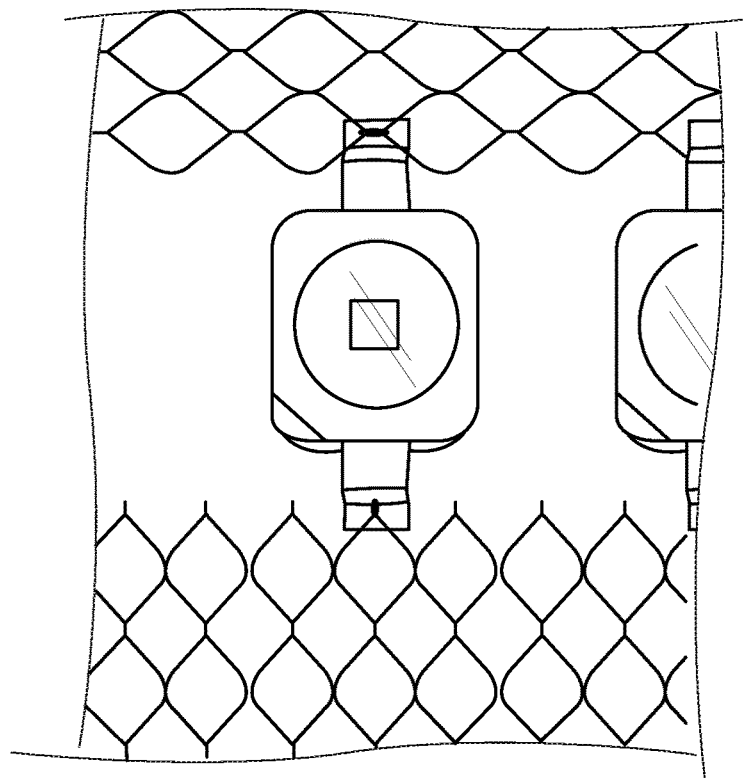
Figure 34:
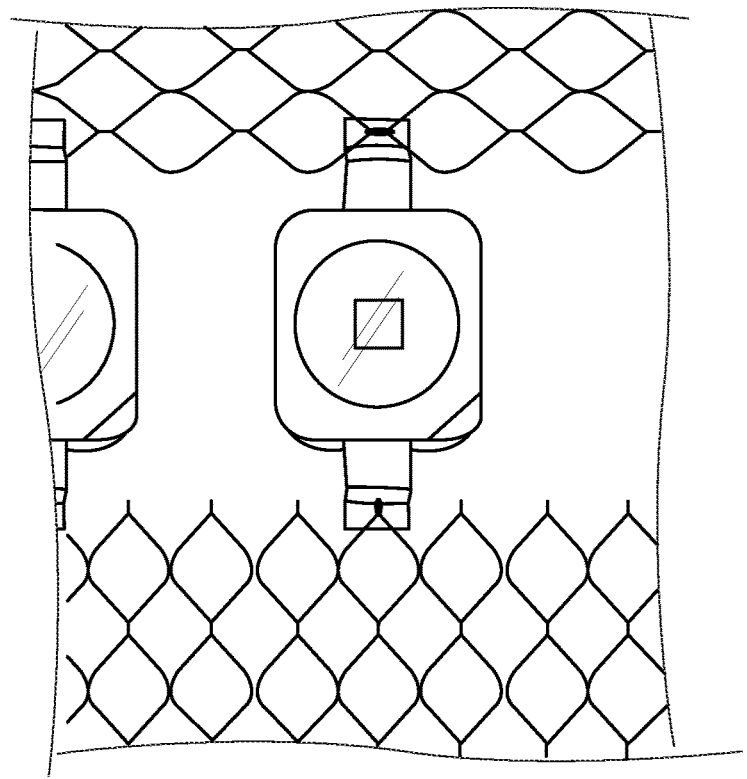
Figure 35:
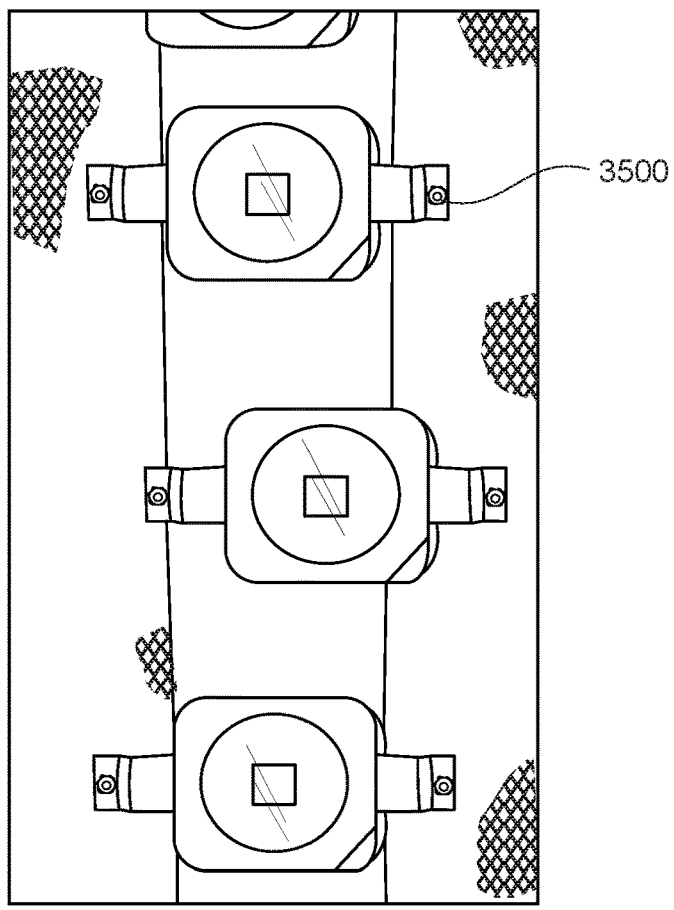
Figure 36:
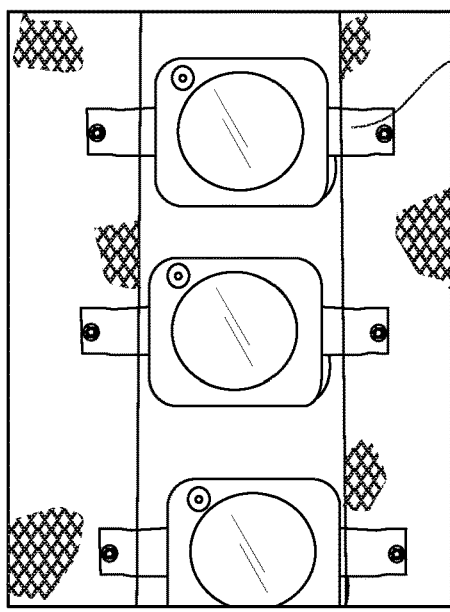
Figure 37:
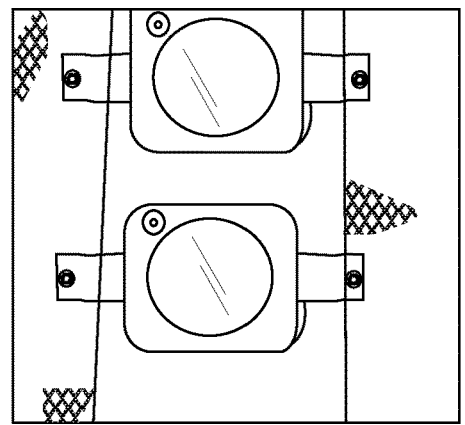

FIG. 26 illustrates an embodiment 2600 where the mesh strands or segments 1502, 1504 are secured to each other via epoxy or flexible silicone structures 2302, which may be infused, covered, embodied with conductive elements to ensure the structure remains flexible, yet electrically conducive, ensuring both segments 1502 are the same voltage.

Note the mesh 2700 may vary its density (FIGS. 27-31), so that a high-powered LED mounting on the mesh uses a significant area of the mesh (both with multiple contacts and/or larger area solder spots), so that more heat is transferred to the mesh segments 1502/1504. In addition, the mesh may be bent in 3-D (i.e. space, three dimensions) 2900 allowing for the significant illumination while dissipating the heat generated.

Figure 38:
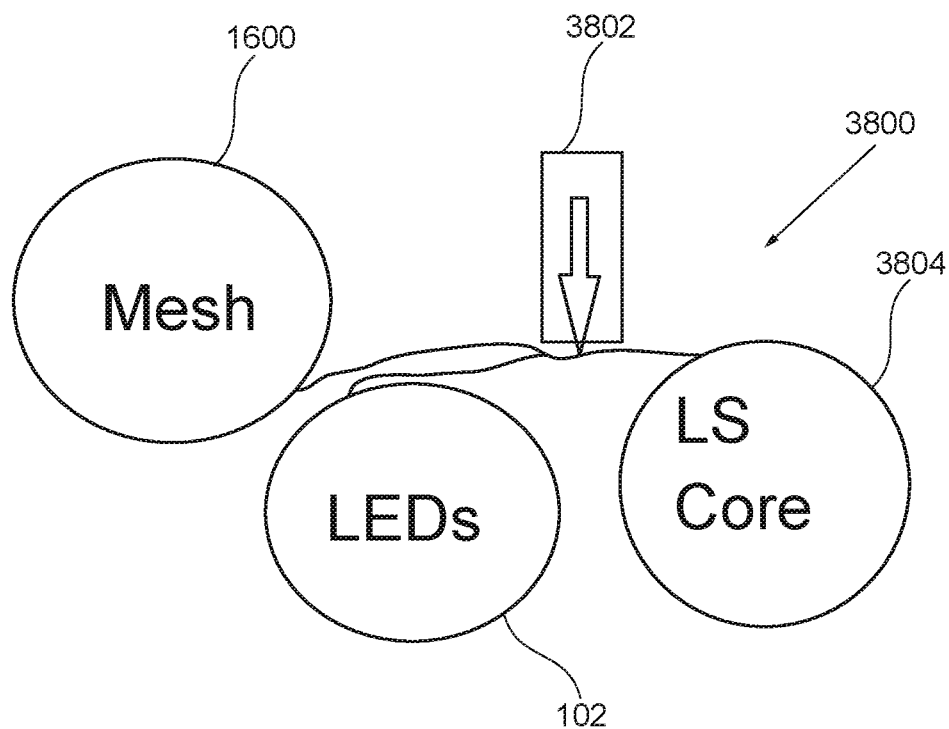
FIG. 38 shows a mounting process grid/mesh LED chip assembly diagram, according to an exemplary embodiment of the invention.
Figure 39:
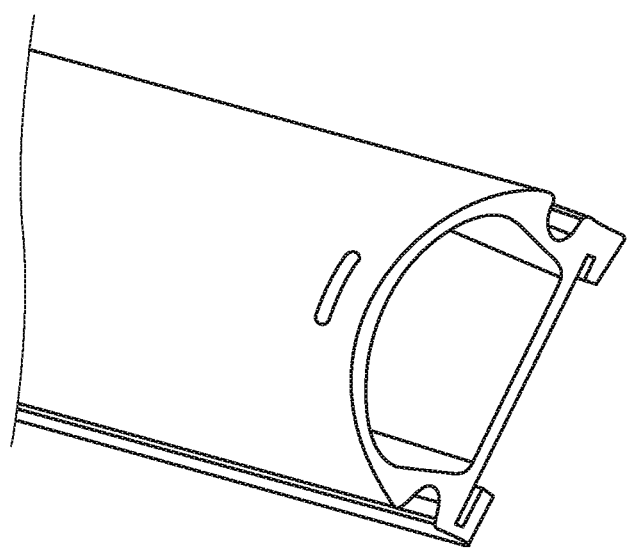
FIGS. 39-44 show the tube mounted electrical connection interface diagram, according to exemplary embodiments of the invention.
Figure 40:
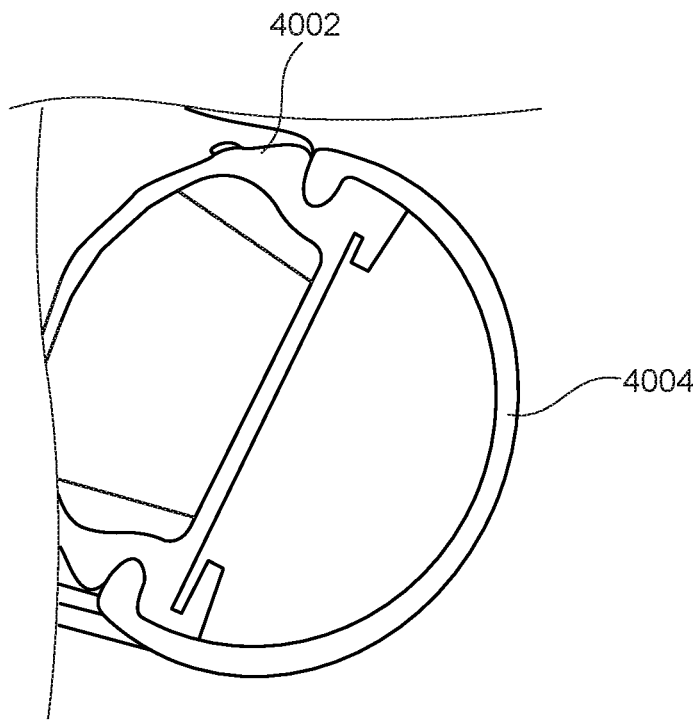
Figure 41:
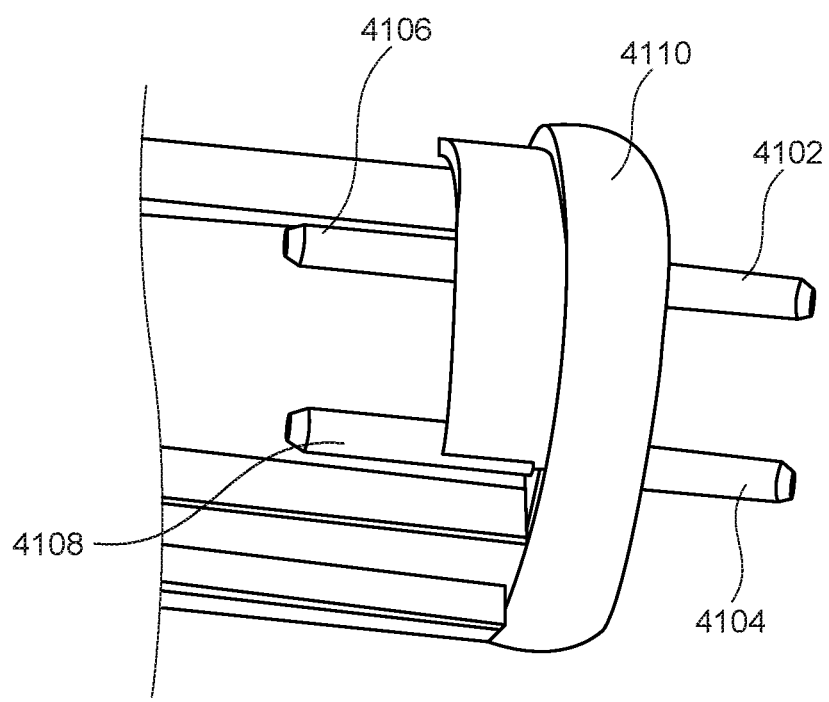
Figure 42:
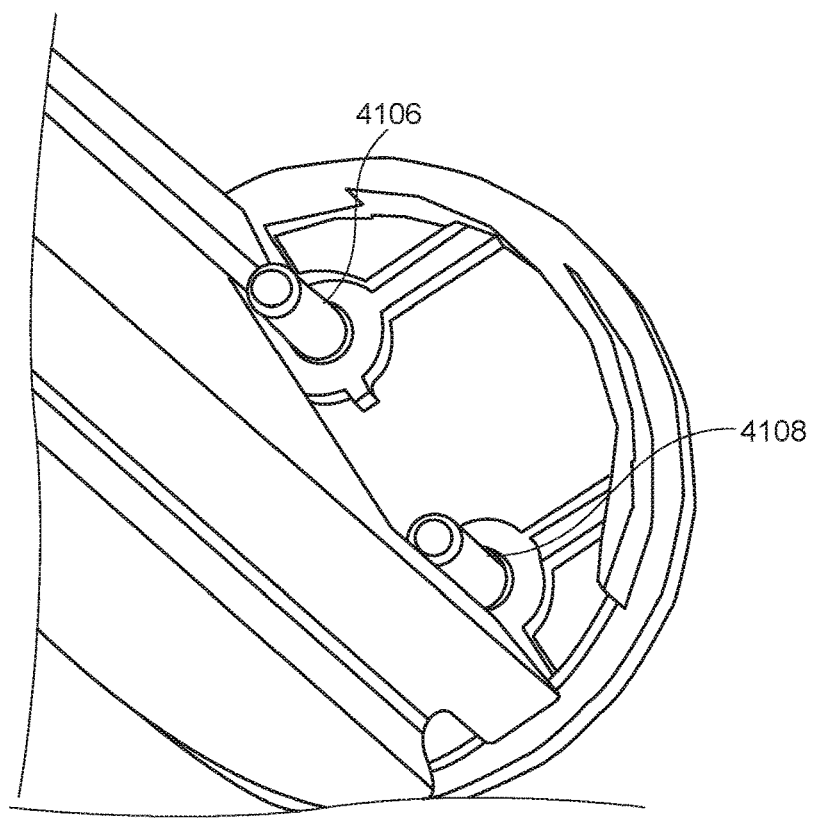
Figure 43:
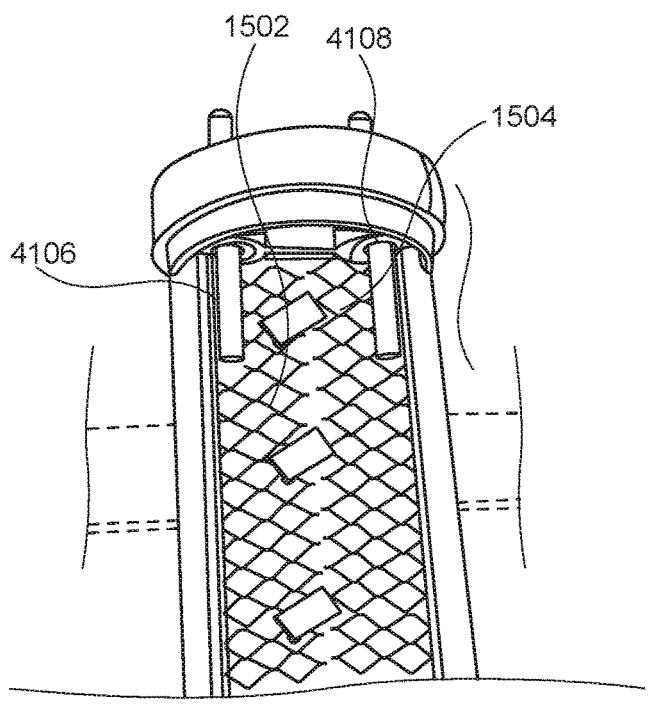
Figure 44:
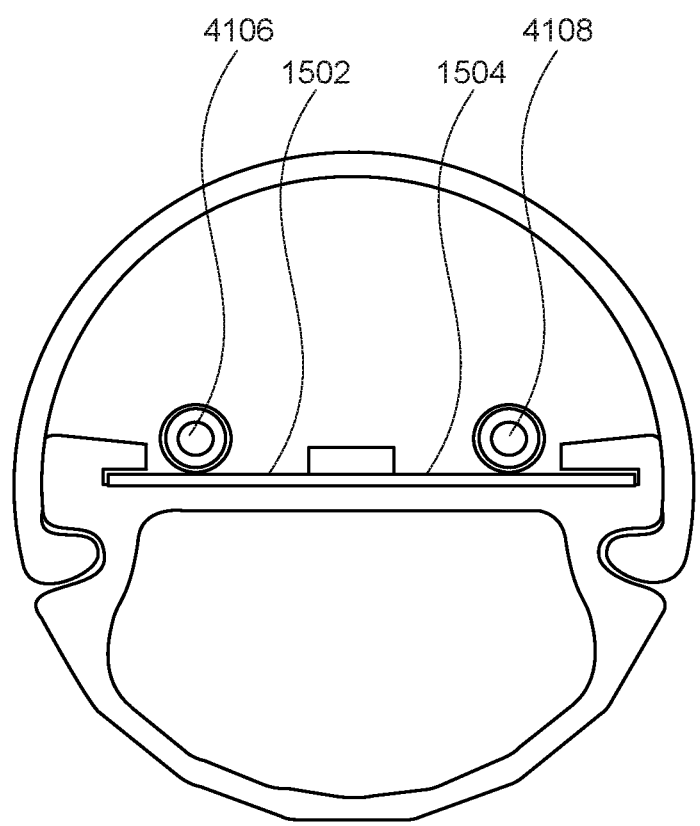
Figure 45:
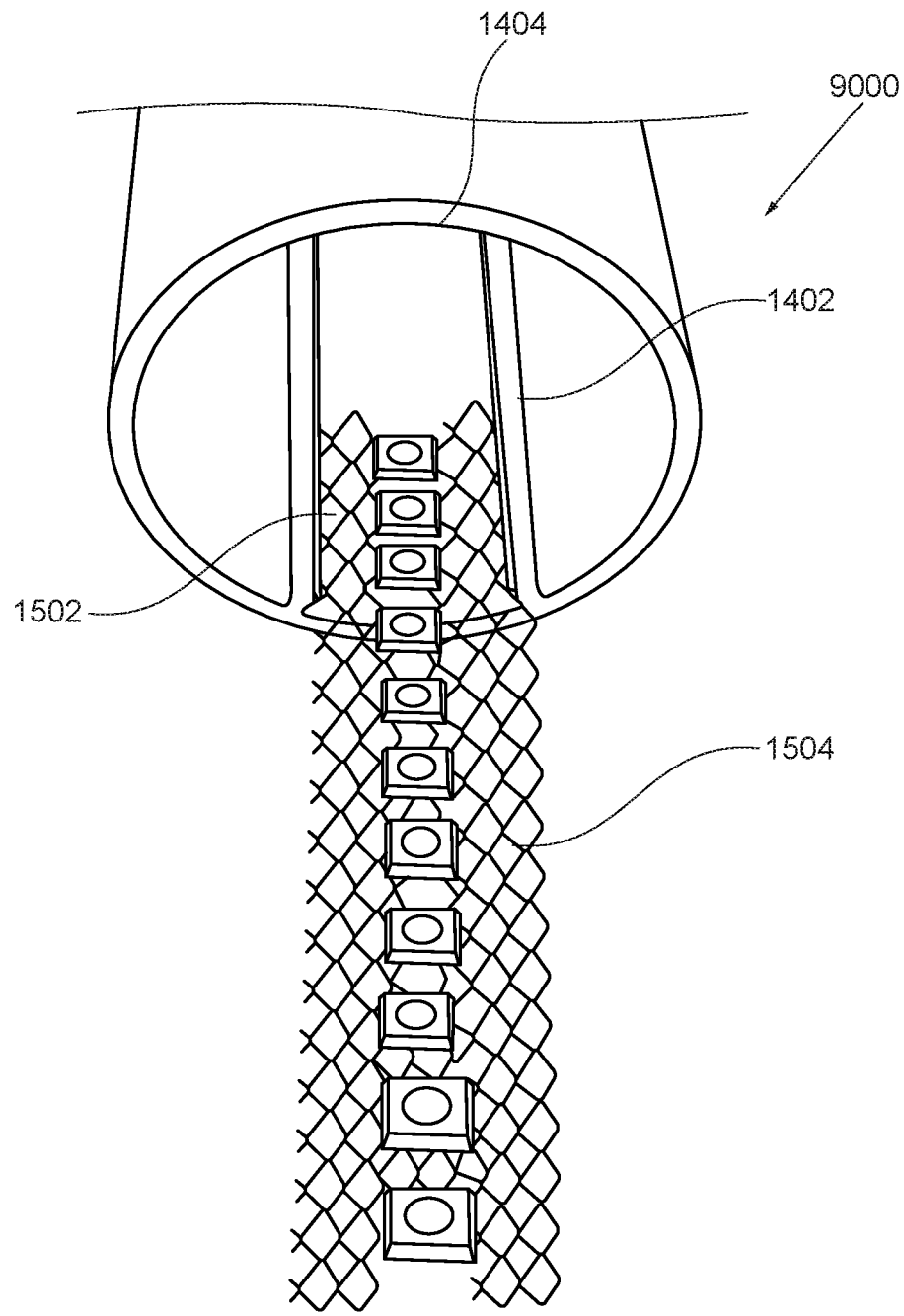
Figure 46:
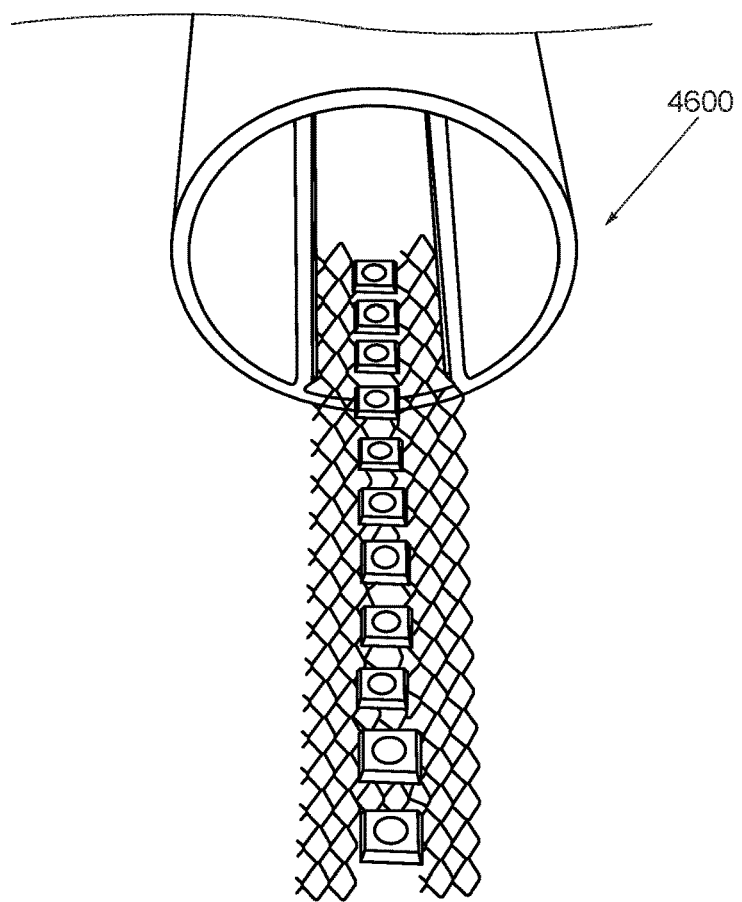
Figure 47:
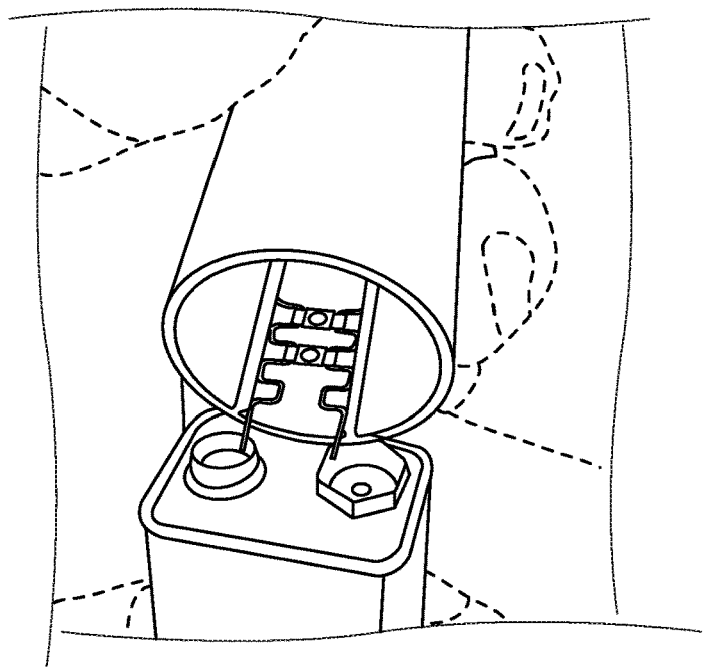

FIG. 38 illustrates a method of mfr. 3800 which comprises a mesh 1600 and LED chips 102 coming together directly from the LED package (without pick/place), by simply bringing the LED string package in contact with the mesh, then welding 3802 the LEDs to the mesh through such methods as laser spot welding and or simple spot welding. Such an attachment would be superior to the traditional soldering where a material is usually reflowed), by avoiding exposing the LED to the higher temperature of the reflow. The mesh would then be used as the 'roll' 3804 in the resulting LED LS core.

When used in a T-5, T-8 or similar fluorescent bulb (FIGS. 39-44) replacement fixture, the ends of the mesh strip 1502/1504 may make direct contact with the tube leads 4102/4104, so that the cap 4110 either passes the voltage/current directly (i.e. with no PCB involved) and/or converts it with electronics inside the cap 4110, so that the mechanical pressure on the mesh 1502/1504 by the leads 4106/4108 both transmits the voltage/current and acts as a heat sink to form a constant and efficient metal-to-metal heat transfer medium to the housing. On one embodiment, the housing is completely translucent, but in another, the bottom of the tube housing 4002 is metal, with the top 4004 being translucent, so that the bottom 4002 acts here as the heat sink.

CONCLUSION

In concluding the detailed description, it should be noted that it would be obvious to those skilled in the art that many variations and modifications can be made to the preferred embodiment without substantially departing from the principles of the present invention. Also, such variations and modifications are intended to be included herein within the scope of the present invention as set forth in the appended claims. Further, in the claims hereafter, the structures, materials, acts and equivalents of all means or step-plus function elements are intended to include any structure, materials or acts for performing their cited functions.

It should be emphasized that the above-described embodiments of the present invention, particularly any "preferred embodiments" are merely possible examples of the implementations, merely set forth for a clear understanding of the principles of the invention. Any variations and modifications may be made to the above-described embodiments of the invention without departing substantially from the spirit of the principles of the invention. All such modifications and variations are intended to be included herein within the scope of the disclosure and present invention and protected by the following claims.

The present invention has been described in sufficient detail with a certain degree of particularity. The utilities thereof are appreciated by those skilled in the art. It is understood to those skilled in the art that the present disclosure of embodiments has been made by way of examples only and that numerous changes in the arrangement and combination of parts may be resorted without departing from the spirit and scope of the invention as claimed. Accordingly, the scope of the present invention is defined by the appended claims rather than the foregoing description of embodiments.

The invention claimed is:

1. An LED light source comprising;
    two or more LED chains, each LED chain formed from one or more LED packages, so that at least one said LED package in each said LED chain has at least one anode lead connected to a common anode wire mesh and at least one corresponding cathode lead connected to a separate cathode wire mesh, so that two or more said LED packages have anodes connected to said first wire mesh and cathodes connected to said second wire mesh;
    wherein one or more of said anode wire mesh(es) and one or more of said cathode wire mesh(es) are electrically connectable to the appropriate polarity of a power source; and
    one or more of each said meshes has one or more bends along their length.

2. The LED light source of claim 1, wherein;
    said anode and cathode wire mesh(es) are comprised of one or more of the following mesh types: wire strand, welded wire mesh, woven wire mesh and/or expanded wire mesh.

3. The LED light source of claim 2, wherein;
    each said anode and each said cathode wire meshes are inserted into a container shaped as a tube; and said one or more bends are made along the edge of said mesh length so as to place pressure against said tube inner wall.

4. The LED light source of claim 3 wherein;
    both said anode and cathode wire meshes are bent along their edges.

5. The LED light source of claim 4 wherein;
    each said anode and cathode wire mesh(es) are secured within said tube to a slot.

6. The LED light source of claim 5 wherein;
    said ends of said tube are capped by one or more caps, with at least one said cap having a lead to make electrical connection with one or more said anode wire mesh, and a lead to make electrical connection with one or more said cathode wire mesh.

7. The LED light source of claim 4 wherein;
    said ends of said tube are capped by one or more caps, with at least one said cap having a lead to make electrical connection with one or more said anode wire mesh, and a lead to make electrical connection with one or more said cathode wire mesh.

8. The LED light source of claim 1, wherein;
    said anode and cathode wire mesh(es) are comprised of one or more of the following mesh types: expanded metal sheets and/or perforated metal sheets.

* * * * *